(12) United States Patent
Higashi

(10) Patent No.: US 6,935,237 B2
(45) Date of Patent: Aug. 30, 2005

(54) PLATE-MAKING SYSTEM OF LIGHT-SENSITIVE LITHOGRAPHIC PRINTING PLATE AND PLATE-MAKING METHOD

(75) Inventor: Tatsuji Higashi, Haibara-gun (JP)

(73) Assignee: Fuji Photo Film Co., Ltd., Kanagawa-ken (JP)

(*) Notice: Subject to any disclaimer, the term of this patent is extended or adjusted under 35 U.S.C. 154(b) by 44 days.

(21) Appl. No.: 10/419,877

(22) Filed: Apr. 22, 2003

(65) Prior Publication Data

US 2003/0207185 A1 Nov. 6, 2003

(30) Foreign Application Priority Data

Apr. 22, 2002 (JP) .......................................... 2002-119244
Sep. 25, 2002 (JP) .......................................... 2002-278964

(51) Int. Cl.[7] .............................. B41C 1/10; G03F 7/20; B65H 43/08; B41L 47/14
(52) U.S. Cl. ..................... 101/463.1; 101/484; 101/477
(58) Field of Search ............................... 101/463.1, 467, 101/477, 484; 271/9.07, 9.11, 104

(56) References Cited

U.S. PATENT DOCUMENTS

| | | | |
|---|---|---|---|
| 5,908,706 A | | 6/1999 | Lehmann et al. |
| 5,992,324 A | | 11/1999 | Rombult et al. |
| 6,085,657 A | | 7/2000 | Rombult et al. |
| 6,422,801 B1 | * | 7/2002 | Solomon ............... 414/416.07 |
| 6,651,561 B2 | * | 11/2003 | Koizumi et al. ............ 101/477 |
| 6,745,694 B1 | * | 6/2004 | Ellis et al. .................. 101/477 |
| 2001/0020688 A1 | * | 9/2001 | Kawamura et al. ....... 250/559.4 |
| 2002/0047234 A1 | * | 4/2002 | Ono et al. ..................... 271/90 |

FOREIGN PATENT DOCUMENTS

| | | |
|---|---|---|
| EP | 1 055 621 A2 | 11/2000 |
| EP | 1 273 964 A1 | 1/2003 |
| JP | 2-1865 * | 1/1990 |
| JP | 6-87551 A | 3/1994 |
| JP | 10-254144 * | 9/1998 |
| JP | 10-323961 A | 12/1998 |

OTHER PUBLICATIONS

Database WPI Week 199919; Derwent Publications Ltd., London, GB; AN 1999–225577; XP 002290189.

* cited by examiner

Primary Examiner—Stephen R. Funk
(74) Attorney, Agent, or Firm—Sughrue Mion, PLLC

(57) ABSTRACT

A plate-making system, in which a light-sensitive lithographic printing plate carrying an interleaf paper superimposed thereon and/or an original plate for making a dummy plate carrying an interleaf paper superimposed thereon are processed in a plate-setter provided with an automatic interleaf paper-removing mechanism and an automatic developing machine, is characterized in that it comprises a means for detecting the presence of any interleaf paper on the lithographic printing plate and/or the original plate or a means for discriminating the interleaf paper, the light-sensitive lithographic printing plate and the original plate. A plate-making method of the invention is characterized by irradiating the interleaf paper, the lithographic printing plate and the original plate for making a dummy plate with sensor light rays after they are passed through the automatic interleaf paper-removing mechanism and determining the intensity of the light to thus detect any interleaf paper possibly present on the plates or discriminate the interleaf paper, the light-sensitive lithographic printing plate and the original plate for making a dummy plate from one another. The plate-making method permits the reliable detection of the presence of interleaf papers on light-sensitive lithographic printing plates and/or original plates for dummy plates and the plate-making operations can thus stably be carried out using a plate-setter and an automatic developing machine.

22 Claims, 1 Drawing Sheet

PLATE-MAKING SYSTEM OF LIGHT-SENSITIVE LITHOGRAPHIC PRINTING PLATE AND PLATE-MAKING METHOD

BACKGROUND OF THE INVENTION

The present invention relates to a plate-making method for treating a light-sensitive lithographic printing plate (an original plate for lithographic printing plate having a light-sensitive layer provided thereon; hereunder also referred to as "light-sensitive plate") on which an interleaf paper is superposed using a plate-setter equipped with a mechanism for automatically removing the interleaf paper and an automatic developing machine as well as a plate-making system used in the foregoing plate-making method. The present invention also relates to a plate-making method for treating a light-sensitive lithographic printing plate on which an interleaf paper is superposed, and an original plate for making a dummy plate having an interleaf paper superimposed thereon using a plate-setter equipped with a mechanism for automatically removing the interleaf paper and an automatic developing machine as well as a plate-making system used in the foregoing plate-making method.

Paper called interleaf paper is in general superimposed on the plate surface of a light-sensitive lithographic printing plate in order to prevent the formation of any defect on the plate surface possibly encountered when transporting the same or accommodating a plate in a plate-setter in which CTP (computer to plate) is imagewise exposed to a laser beam and to prevent any adhesion of a plate to another one under high humidity conditions. In addition, there has conventionally been used a plate-making device provided with a means for automatically removing an interleaf paper from the plate surface and disposing the same (hereunder referred to as "automatic interleaf paper-removing mechanism") during the plate-making process (see, for instance, Patent Document 1 listed below). In such a plate-setter provided with an automatic interleaf paper-removing mechanism, the interleaf paper is automatically removed from the plate surface. When the interleaf paper is not removed for some reason and the plate carrying the interleaf paper is exposed to a laser beam, however, the interleaf paper is often scorched or burned. In addition, when the light-sensitive plate is a photopolymerizable lithographic printing plate and the plate is fed to an automatic developing machine together with the interleaf paper, the interleaf paper is scorched and optionally burned and thus, this may become the origin of a fire in a pre-heating zone of the developer. More specifically, the first step in the automatic developing machine is one in which the light-sensitive plate is heated to a temperature of about 125° C. with a ceramic heater or hot air in the pre-heating zone and therefore, the temperature of the heater is increased even to 650° C. Moreover, if the interleaf paper is introduced into a pre-water-washing zone and/or a developing zone, the interleaf paper is broken into small pieces, dispersed into water or a developer and this may result in the clogging of the piping system of the developing machine or this may optionally make the use of the developer impossible. Further, when the light-sensitive plate is a thermally cross-linkable light-sensitive lithographic printing plate and the plate carrying an interleaf paper superposed thereon is fed to a heating oven, the interleaf paper is scorched, optionally burned and thus, this may become the origin of a fire therein since the plate is heated to a temperature of about 150° C.

Moreover, in case where in, for instance, color newspaper printing, the printing operation must be carried out by two-color or mono-color printing since the whole space is not subjected to the color printing, it is necessary to conduct such printing operations while fitting a printing plate free of any light-sensitive layer (dummy plate) onto the plate cylinder, which is not used. There has not yet been developed any dummy plate specially designed for CTP and therefore, a light-sensitive plate is developed without exposure to light to give a dummy plate or an original plate for making a dummy plate for a conventional PS plate is developed in an automatic developing machine generally used for treating the conventional PS plate. However, this suffers from problems such that the formation of a dummy plate by such a method is quite disadvantageous from the economical standpoint and that the practice of such method requires the use of a quite large space since two lines of plate-making systems should be provided. In this respect, when using an original plate for making a dummy plate specially designed for CTP, which comprises an aluminum plate provided thereon with a light-insensitive layer, it is required to use only one line of plate-processing system and this is quite advantageous from the economical standpoint. However, the interleaf paper superposed on such an original plate for making a dummy plate may suffer from problems similar to those discussed above.

In this respect, there has conventionally been reported the development of a device for detecting light-sensitive lithographic printing plates using a semiconductor laser beam in order to prevent any supply, into a plate-making device, of a plurality of light-sensitive lithographic printing plates, at a time, which are adhered to one another when they are stored in the superimposed conditions (see, for instance, the patent document 2 specified below). In this device, the side of printing plates fed to a plate-making device is irradiated with a laser beam to thus detect whether a specific printing plate fed thereto comprises at least two plates adhered to one another, or not on the basis of the time required for the side thereof to transverse the laser beam.

Patent Document 1: Japanese Un-Examined Patent Publication (hereunder referred to as "J.P. KOKAI") Hei 10-323961

Patent Document 2: J.P. KOKAI Hei 6-87551

SUMMARY OF THE INVENTION

Accordingly, it is an object of the present invention to provide a plate-making system, which permits the reliable detection of the presence of any interleaf paper on a light-sensitive lithographic printing plate and the stable production of lithographic printing plates as well as a plate-making method. Moreover, it is also an object of the present invention to provide a method, which permits the preparation of a lithographic printing plate and a dummy plate using a single processing line without preparing separate developing lines for the light-sensitive lithographic printing plate and the original plate for making a dummy plate, which permits the reliable detection of the presence of any interleaf paper on a light-sensitive lithographic printing plate and an original plate for making a dummy plate and which also permits the stable production of such plates.

The foregoing object of the present invention can be solved by the use of a plate-making system comprising a means for detecting the presence of any interleaf paper on a light-sensitive lithographic printing plate and/or an original plate for making a dummy plate, or a means for discriminating an interleaf paper, a light-sensitive lithographic printing plate and an original plate for making a dummy plate, in a plate-making method in which the light-sensitive lithographic printing plate carrying such an interleaf paper superimposed thereon and/or the original plate for making a dummy plate likewise carrying such an interleaf paper superimposed thereon are processed in a plate-setter provided with an automatic interleaf paper-removing mechanism and an automatic developing machine.

More specifically, the present invention relates to a plate-making system in which a light-sensitive lithographic printing plate carrying an interleaf paper superimposed thereon and/or an original plate for making a dummy plate carrying an interleaf paper superimposed thereon are processed in a plate-setter provided with an automatic interleaf paper-removing mechanism and an automatic developing machine, wherein the system is provided with a means for detecting the presence of any interleaf paper on the light-sensitive lithographic printing plate and/or the original plate for making a dummy plate; and a plate-making system in which a light-sensitive lithographic printing plate carrying an interleaf paper superimposed thereon and/or an original plate for making a dummy plate carrying an interleaf paper superimposed thereon are processed in a plate-setter provided with an automatic interleaf paper-removing mechanism and an automatic developing machine, wherein the system is provided with a means for discriminating the interleaf paper, the light-sensitive lithographic printing plate and the original plate for making a dummy plate.

According to another embodiment of the present invention, there is provided a plate-making method, which comprises the step of treating a light-sensitive lithographic printing plate carrying an interleaf paper superimposed thereon and/or an original plate for making a dummy plate carrying an interleaf paper superimposed thereon in a plate-setter provided with an automatic interleaf paper-removing mechanism and an automatic developing machine, the method being characterized by irradiating the interleaf paper, the light-sensitive lithographic printing plate and the original plate for making a dummy plate with sensor light rays after they are passed through the automatic interleaf paper-removing mechanism and determining the intensity of the light reflected from the same to thus detect any interleaf paper possibly present on the plates. According to a further embodiment of the present invention, there is also provided a plate-making method, which comprises the step of treating a light-sensitive lithographic printing plate carrying an interleaf paper superimposed thereon and/or an original plate for making a dummy plate carrying an interleaf paper superimposed thereon in a plate-setter provided with an automatic interleaf paper-removing mechanism and an automatic developing machine, the method being characterized by irradiating the interleaf paper, the light-sensitive lithographic printing plate and the original plate for making a dummy plate with sensor light rays after they are passed through the automatic interleaf paper-removing mechanism and determining the intensity of the light reflected from the same to thus discriminate the interleaf paper, the light-sensitive lithographic printing plate and the original plate for a dummy plate from each other.

The plate-making system and plate-making method according to the present invention permit the processing of a light-sensitive lithographic printing plate carrying an interleaf paper superimposed thereon in a plate-setter and an automatic developing machine with safety. Moreover, the method of the present invention permits the economical processing of a light-sensitive lithographic printing plate carrying an interleaf paper superimposed thereon and/or an original plate for making a dummy plate carrying an interleaf paper superimposed thereon using a single plate-making line comprising a plate-setter and an automatic developing machine with safety without preparing separate plate-making lines for these lithographic printing plate and the original plate for making a dummy plate.

DESCRIPTION OF THE PREFERRED EMBODIMENTS

Figure 1:
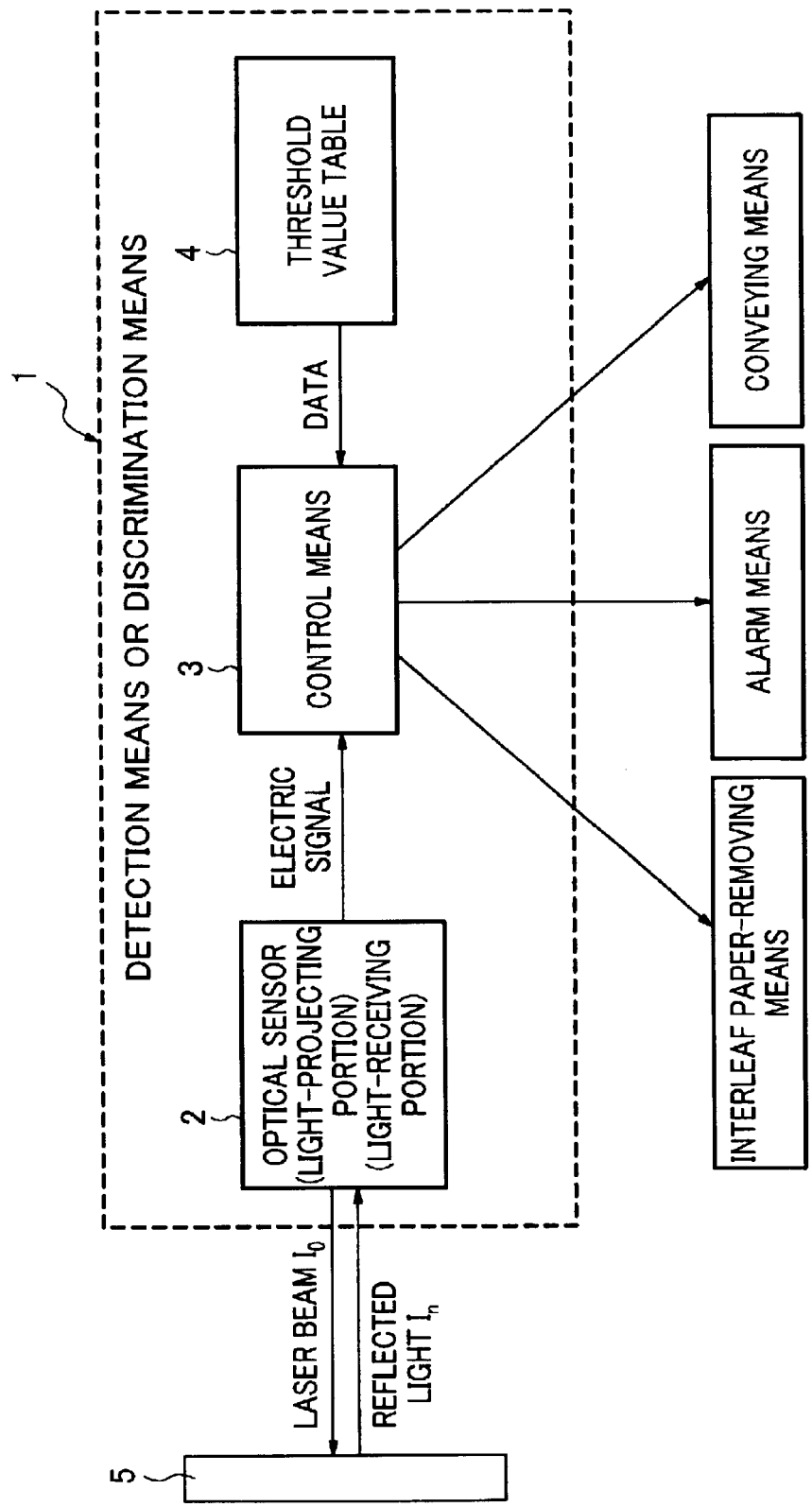
FIG. 1 is a diagram for illustrating the concept of the detection means or discrimination means used in the plate-making system according to the present invention.

The plate-making system and the plate-making method of the present invention will hereunder be described in more detail.

Plate-Setter The term "plate-setter" means, in its narrow sense, a device for directly outputting information processed by a computer onto a plate fundamentally according to a laser system and examples thereof include the outer drum system, which comprises winding a plate on the exterior of a drum and exposing the plate while rotating the drum; the inner drum system, which comprises fixing a plate onto the inner face of a drum and exposing the plate by rotating a light source; and the flat head system in which a plate is horizontally conveyed. The term means, in its broader sense, the whole device comprising exposure zone according to such a laser output system and even a plate-supply zone and a plate-discharge zone before and behind the exposure zone. In the specification, the term is used in its broader sense unless otherwise specified.

The plate-setter used in the present invention is equipped with an automatic interleaf paper-removing mechanism. As such an automatic interleaf paper-removing mechanism, there have been known various type ones such as a mechanism in which an interleaf paper is peeled off from the plate surface while shifting the interleaf paper by the action of rubber rollers; a mechanism in which an interleaf paper is peeled off from the plate surface by lifting the interleaf paper with, for instance, a sucking disk; a mechanism in which an interleaf paper is blown off by a wind pressure; and a mechanism, which makes use of charging of an interleaf paper. All of these known automatic interleaf paper-removing mechanisms are included in the scope of the present invention. This automatic interleaf paper-removing mechanism is in general arranged before the exposure zone and in front of a sensor device of the plate-setter as will be described later.

Examples of plate-setters usable in the present invention include Luxel Plate-setter P-9600 CTP (available from Fuji Photo Film Co., Ltd.) and Luxel Plate-setter T9000 (likewise available from Fuji Photo Film Co., Ltd.).

Automatic Developing Machine

The automatic developing machine for developing lithographic printing plates usable in the present invention comprises, for instance, a pre-heating zone, a pre-water-washing tank, a developing tank, a water-washing tank, a gumming tank and a drying zone arranged in this order. The preheating zone is one for heating a lithographic printing plate imagewise exposed to light at a constant temperature and may be omitted, but the use thereof is preferred for ensuring the stable printing durability of the resulting printing plate. When the light-sensitive plate is a thermally cross-linkable light-sensitive lithographic printing plate, the pre-heating zone and the pre-water-washing tank can be omitted, but it is necessary to separately dispose a heating oven between the plate-setter and the automatic developing machine.

In the pre-water-washing tank, the water-soluble oxygen-barrier protective layer arbitrarily applied onto a photopolymerizable light-sensitive lithographic printing plate is removed by washing with water.

In the developing tank, the un-exposed area of the light-sensitive lithographic printing plate is removed with an alkali developer and the light-insensitive resin layer of an original plate for dummy plates is simultaneously removed.

In the water-washing tank, the plate is washed with water to remove the alkali developer remaining on the surface of the plate after the development and to reduce the amount of the alkali solution brought into the subsequent step or the gumming tank.

In the gumming tank, a gumming solution or a finisher is applied onto the developed plate to thus return the alkalified resin in the light-sensitive plate to acidic one, in order to prevent the occurrence of any damage of the image area due to the development and to prevent any contamination and damaging of the non-image area.

Detection Means or Discrimination Means

The detection means for detecting the presence of an interleaf paper on a plate used in the plate-making system according to the first aspect of the present invention comprises an optical sensor, which comprises a light-projecting portion for irradiating an interleaf paper, a light-sensitive lithographic printing plate and/or an original plate for dummy plates with sensor light rays and a light-receiving portion for receiving light rays reflected from the same; and a control means for outputting a control signal after detecting the presence of the interleaf paper on the basis of the intensity of the reflected light received by the light-receiving portion and.

The means for discriminating an interleaf paper, an original plate for dummy plates or a light-sensitive lithographic printing plate from one another used in the plate-making system according to another aspect of the present invention comprises a light-projecting portion for irradiating the interleaf paper, the light-sensitive lithographic printing plate and/or the original plate for dummy plates with sensor light rays and a light-receiving portion for receiving light rays reflected from the same; and a control means for outputting a control signal after discriminating the interleaf paper, the original plate for dummy plates or the light-sensitive lithographic printing plate from one another on the basis of the intensity of the reflected light received by the light-receiving portion.

The foregoing control means is one for transmitting signals, preferably electric signals, to each means, which performs a motion, for instance, (1) if the presence of an interleaf paper is detected, the transmission of the light-sensitive lithographic printing plate and/or the original plate for dummy plates in the plate-setter or the automatic developing machine is stopped; (2) if the presence of an interleaf paper is detected, the interleaf paper is again removed by the interleaf paper-removing mechanism; (3) if the presence of an interleaf paper is detected, a warning is displayed or an alarm signal is outputted; or (4) if the presence of interleaf paper is not detected but an original plate for dummy plate is detected, any exposure treatment in the plate-setter is omitted.

The detection or discrimination means as well as the detection or discrimination methods in the plate-making system and methods of the present invention will further be described in more specifically below.

FIG. 1 is a diagram for illustrating the concept of a detection means or discrimination means used in the plate-making system according to the present invention. The detection means or discrimination means herein used will be described below with reference to FIG. 1. Previously, the threshold value (1) is set at an intermediate position between the stronger one out of the intensity $I_1$ of light reflected by a light-sensitive lithographic printing plate and that $I_2$ of light reflected by an original plate for dummy plates and the weaker one out of the intensity $I_3$ of light reflected by an interleaf paper on the light-sensitive lithographic printing plate and that $I_4$ of light reflected by an interleaf paper on the original plate for dummy plates. A plate 5 conveyed through the interior of the plate-setter is irradiated with the sensor light rays emitted from a light-projecting portion of an optical sensor 2, the light reflected from the plate is received by a light-receiving portion of the optical sensor 2, the intensity of the reflected light is converted into an electric signal and the signal is inputted into a control means 3 through an amplification unit (not shown). In the control means 3, the intensity (2) of the reflected light converted into the electric signal is compared with the predetermined threshold value (2) and if (1)>(2), it is recognized that the interleaf paper is certainly removed. On the contrary, if (1)<(2), it is judged that the interleaf paper is not yet removed, the control means 3 outputs an electric signal to, for instance, the plate-setter, the automatic developing machine and a computer of a higher rank to thus instruct any corresponding actions. For instance, the plate in question is again brought back to the position prior to the automatic interleaf paper-removing mechanism to remove the same, an alarm signal is outputted or the plate-making operation is automatically suspended.

The plate-making system used in another embodiment of the present invention will hereunder be described in detail. Previously, the threshold value of a sensor is set at an intermediate position between the weaker two intensities of reflected light rays among the intensity $I_1$ of light reflected by a light-sensitive lithographic printing plate, that $I_2$ of light reflected from an original plate for dummy plates, that $I_3$ of light reflected from the interleaf paper on the light-sensitive plate and that $I_4$ of light reflected from the interleaf paper on the original plate. For instance, if a relation: $I_1<I_2<I_3$, $I_4$ is valid, a threshold value (3) is set at an intermediate between $I_1$ and $I_2$ and a threshold value (4) is set at an intermediate between $I_2$ and the weaker one among $I_3$ and $I_4$. A plate 5 conveyed through the interior of the plate-setter is irradiated with the sensor light rays emitted from a light-projecting portion of an optical sensor 2, the light reflected from the plate is received by a light-receiving portion of the optical sensor 2, the intensity of the reflected light is converted into an electric signal and the signal is inputted into a control means 3 through an amplification unit (not shown). In the control means 3, the intensity (5) of the reflected light converted into the electric signal is compared with the predetermined threshold values (3), (4) and if the following relation: (5)<(3) (<(4)) is valid, it is recognized that the plate 5 is a light-sensitive lithographic printing plate from which the interleaf paper is certainly removed and the plate is thus conveyed to an exposure device and an automatic developing machine and processed therein. Moreover, if the relation: (5)<(3)<(4) is valid, it is recognized that the plate 5 is an original plate for dummy plates from which the interleaf paper is removed and accordingly, the plate is conveyed to an automatic developing machine and processed therein, without being exposed to a laser beam. Further, if the relation: (3)<(4)<(5) is valid, it is recognized that the plate is an interleaf paper (or the interleaf paper is not removed) and the control means 3 outputs an electric signal to, for instance, the plate-setter, automatic developing machine or the computer of a higher rank to thus instruct any corresponding actions. For instance, the plate in question is again brought back to the position prior to the automatic interleaf paper-removing mechanism to remove the same, an alarm signal is outputted or the plate-making operation is automatically suspended.

In the present invention, the optical sensor usable herein and comprising a light-projecting portion for irradiating plates with sensor light rays and a portion for receiving the light reflected from the plates may suitably be, for instance, a sensor device comprising a laser oscillator and light-receiving elements (or photodetectors). Such a sensor device is disposed behind the automatic interleaf paper-removing mechanism and before the light-exposing portion of the plate-setter, and/or behind the light-exposing portion of the plate-setter and the automatic developing machine or in front of the heating oven. Optical sensors are preferably disposed on the both positions because of high reliability.

As the sensor light, it is preferred to select one having a wavelength, which does not sensitize the light-sensitive lithographic printing plate and which can be absorbed by the light-sensitive plate and the original plate for dummy plates. For instance, when the light-sensitive plate comprises a coloring agent for making the material visible, it may be light rays having a wavelength corresponding to that capable of being absorbed by the coloring agent. Specific examples preferably used herein are those listed below.

When the light-sensitive lithographic printing plate is a plate capable of being exposed by FD-YAG Laser (532 nm) and an argon laser (488 nm, 514.5 nm), the plate commonly comprises blue to purple-colored colorant, which never serves as a filter for the light having a wavelength ranging from 488 to 532 nm and having a peak absorbance falling within the range of from 600 to 800 nm. Therefore, examples thereof preferably used in this case include laser diodes having a wavelength ranging from 600 to 900 nm, semiconductor lasers and He—Ne lasers (633 nm). Specific examples thereof are semiconductor lasers having wavelengths falling within the red to near infrared region such as 630 nm, 650 nm, 680 nm, 785 nm and 830 nm, from the economical standpoint.

When the light-sensitive lithographic printing plate is one corresponding to purple semiconductor lasers (such as a laser having a wavelength of 405 nm), the plate in general comprises a green to purple-colored colorant, which never serves as a filter for the light having a wavelength of 405 nm and having a peak absorbance falling within the range of from 500 to 800 nm. Accordingly, examples thereof preferably used in this case are laser diodes having a wavelength ranging from 500 to 900 nm, semiconductor lasers, a He—Ne lasers (633 nm) an argon ion laser (514.5 nm) and FD-YAG Laser (532 nm). Specific examples thereof are semiconductor lasers having wavelengths falling within the red to near infrared region such as 630 nm, 650 nm, 680 nm, 785 nm and 830 nm, from the economical standpoint.

When the light-sensitive lithographic printing plate is one corresponding to infrared semiconductor lasers (such as those having a wavelength of 830 nm or 860 nm), the plate in general comprises a colorant absorbing light rays having wavelengths falling within the visible light region, which never serves as a filter for the visible light and having a peak absorbance falling within the range of from 400 to 800 nm. Accordingly, examples thereof preferably used in this case are laser diodes having a wavelength ranging from 400 to 800 nm, semiconductor lasers, a He—Ne lasers (633 nm) an argon ion laser (514.5 nm) and FD-YAG Laser (532 nm). Specific examples thereof are semiconductor lasers having wavelengths falling within the red to near infrared region such as 630 nm, 650 nm, 680 nm, 785 nm and 830 nm, from the economical standpoint.

Laser oscillators and photo-receiving elements therefor have been commercially available from various makers and therefore, the presence of any interleaf paper may be detected by variously combining these devices. Detectors each comprising a set of laser oscillator and photo-receiving elements have likewise been put on the market and accordingly, it is rather convenient to use these detectors. Specific examples of such detectors include, but are not limited to combinations of Sensor Head LV-H42 (a semiconductor laser having a wavelength of 650 nm and an output of 3 mW) and LV-H41 (a semiconductor laser having a wavelength of 785 nm and an output of 2.5 mW) with Amplification Unit LV-21A available from KYENCE Company. The sensor head comprises a light-projecting portion and a light-receiving portion on a single head.

The surface of a plate is irradiated with a laser beam such as that having a wavelength of 650 or 785 nm at an arbitrary angle, the laser beam reflected from the surface is received by the light-receiving portion to thus determine the intensity of the reflected light and the presence of an interleaf paper is judged on the basis of the intensity of the reflected light thus detected. For instance, when any original plate for a dummy plate is not fed to the plate-setter and only a light-sensitive plate is mounted thereon, the presence of any interleaf paper may be detected by determining the intensities of light rays reflected from the light-sensitive plate and the interleaf paper thereon and setting a threshold value of the sensor at an intermediate position between the intensities of light rays reflected from the light-sensitive plate and the interleaf paper. On the other hand, when a light-sensitive plate and an original plate for a dummy plate are simultaneously mounted on the plate-setter, the presence of any interleaf paper may be detected by setting a threshold value of the sensor at an intermediate position between the stronger one out of the intensity of light reflected by a light-sensitive plate and that of light reflected by an original plate for dummy plates and the weaker one out of the intensity of light reflected by an interleaf paper on the light-sensitive plate and that of light reflected by an interleaf paper on the original plate for making a dummy plate.

Moreover, when discriminating a light-sensitive lithographic printing plate, an original plate for dummy plates, an interleaf paper on the light-sensitive lithographic printing plate and an interleaf paper on the original plate for dummy plates from one another, it may possible to use a combination of at least two sensors differing in their wavelengths or a combination of at least two sensors having the same wavelength and different threshold values.

Alternatively, the light-sensitive plate, the original plate for a dummy plate and the interleaf paper may be discriminated from one another by the use of a pigmented light-sensitive plate, a pigmented original plate for a dummy plate and a pigmented interleaf paper or by combining a plurality of sensors having different wavelengths. For instance, when the light-sensitive plate is colored blue and the original plate for a dummy plate is almost colorless, the light-sensitive plate, the original plate for a dummy plate and the interleaf paper can be discriminated by the use of pigmented interleaf papers and two sensors whose threshold values are different from one another. More specifically, the removal of the interleaf paper can be confirmed or judged by setting the threshold value of one sensor at an intermediate between the intensities of light rays reflected by the blue light-sensitive plate and the pigmented interleaf paper and that of the other sensor at an intermediate between the intensities of light rays reflected by the almost colorless original plate and the pigmented interleaf paper. It is also possible to discriminate the interleaf paper from the light-sensitive plate and the original plate for a dummy plate through the use of a pigmented light-sensitive plate and a pigmented original plate for a dummy plate.

The plate-making method of the present invention is, for instance, carried out as follows: When a light-sensitive lithographic printing plate and/or an original plate for a dummy plate are accommodated in a cassette of a plate-setter, the interleaf paper is removed from the light-sensitive lithographic printing plate by the action of an automatic interleaf paper-removing mechanism on the basis of the instruction outputted from a computer of a higher rank while the light-sensitive plate is conveyed in the plate-supply portion of the plate-setter and the removal of the interleaf paper is judged by the detection means such as that described above. More specifically, the presence of any interleaf paper is detected by irradiating the interleaf paper with sensor light rays to thus determine the intensity of the light reflected from the interleaf paper and comparing the intensity thus determined with the threshold value of the sensor specified in advance. When the intensity of the light reflected from the interleaf paper is smaller than the threshold value (the interleaf paper is certainly removed), the plate is imagewise exposed to light in the subsequent exposing device and automatically conveyed to an automatic developing machine or a heating oven through a plate-discharge portion of the plate-setter and developed therein. On the other hand, when the reflected light intensity is greater than the threshold value (the interleaf paper has not yet been removed), a control means inputs an electric signal or the like to the plate-setter and the transportation of the plate is discontinued in response to the signal. Alternatively, it is also possible to send a signal that instructs the plate-setter to again remove the interleaf paper. In case of an original plate for a dummy plate, the interleaf paper is removed, the presence of any interleaf paper is detected by a sensor, the original plate is then automatically transported within the setter without being subjected to any laser light exposure, fed to an automatic developing machine and developed therein, when the interleaf paper is certainly removed.

Interleaf Paper

The interleaf paper used in the present invention may be any one inasmuch as it can ensure the protection of the surface of the light-sensitive lithographic printing plate and the original plate for making a dummy plate.

Examples thereof include paper impregnated with a wax (J.P. KOKOKU Sho 61-19025), paper impregnated with a fatty acid or a salt thereof (J.P. KOKAI Sho 57-99647), polyolefinic pulp and such pulp containing alkali metal halides (J.P. KOKAI Sho 57-99647), interleaf papers coated with a plastic material such as polyethylene film (J.P. KOKOKU Sho 57-23259), those obtained by adding a binder such as starch, a synthesized sizing agent and/or aluminum sulfate to paper stock (J.P. KOKAI Hei 10-282681), those obtained by adding or applying a binder, an inorganic electrolyte and/or a wetting agent to paper stock and those obtained by adding or applying a conductive agent such as a cationic high molecular weight electrolyte or conductive zinc oxide (J.P. KOKAI Hei 10-197992), and those obtained by adding a fluorine atom-containing surfactant, a fluorine atom-containing resin, a silicone resin and/or a sizing agent (J.P. KOKAI Hei 9-292713). Examples of interleaf papers usable herein also include those disclosed in, for instance, Japanese Patent Application Serial Nos. 2000-96475, 2000-70263, 2000-58533, 2000-58515 and Hei 11-319169.

Original Plate for Making Dummy Plates

The term "dummy plate" means a plate for fitting onto a plate cylinder, which is not used, in color newspaper printing or the like wherein the printing operation must be carried out by two-color or mono-color printing. In addition, the term "original plate for making a dummy plate" means an original plate prior to the plate-making operation for preparing such a dummy plate. In the present invention, the original plate for a dummy plate preferably comprises an aluminum substrate having a hydrophilic surface provided thereon with a light-insensitive resin layer capable of being dissolved in or getting swollen with an alkaline aqueous solution. This is because the use of an original plate obtained by applying such a resin makes it possible to treat the original plate in devices similar to the plate-setter and the automatic developing machine used for processing a light-sensitive lithographic printing plate. Primer coating layers of water-soluble compounds as will be detailed later may be applied onto a light-sensitive lithographic printing plate and a substrate having a hydrophilic surface.

A primer-coating layer is arbitrarily applied onto an aluminum substrate having a hydrophilic surface and a light-insensitive resin layer is then applied onto the primer-coating layer. The resins preferably used in the light-insensitive resin layer may be organic high molecular weight compounds, which have an acid content ranging from 0.1 to 3.0 meq/g and preferably 0.2 to 2.0 meq/g and which are substantially insoluble in water (or insoluble in neutral or acidic aqueous solutions) and have film-forming properties and more preferably those capable of being dissolved in or getting swollen with an alkaline aqueous solution. In this respect, if the acid content thereof is less than 0.1 meq/g, it is quite difficult to dissolve the organic polymer compound, while if it exceeds 3.0 meq/g, the strength of the film is weakened, in particular, when it is stored under high temperature and high humidity conditions. The molecular weight of the light-insensitive resin is not restricted to any specific range inasmuch as it may be soluble in a coating solvent and soluble in or swellable with an alkaline aqueous solution, but it in general ranges from 1,000 to 1,000,000 and preferably 10,000 to 500,000. This is because if the molecular weight thereof is too small, the strength of the resulting film is low, while if it is too high, the solubility of the resulting film is deteriorated.

Examples of particularly preferred light-insensitive resins are copolymers containing, as an essential component, acrylic acid, methacrylic acid, crotonic acid or maleic acid moiety such as multi-component copolymers of 2-hydroxyethyl acrylate or 2-hydroxyethyl methacrylate, acrylonitrile or methacrylonitrile, acrylic acid or methacrylic acid and other optional copolymerizable monomers as disclosed in, for instance, J.P. KOKAI Sho 50-118802; multi-component copolymers of acrylic acid or methacrylic acid, acrylic acid, or methacrylic acid and other optional copolymerizable monomers, which have terminal hydroxyl groups and which are esterified with groups each containing a dicarboxylic acid ester residue, as disclosed in, for instance, J.P. KOKAI Sho 53-120903; multi-component copolymers of monomers each having an aromatic hydroxide on the terminal (such as N-(4-hydroxyphenyl) methacrylamide), acrylic acid, or methacrylic acid and other optional copolymerizable monomers as disclosed in, for instance, J.P. KOKAI Sho 54-98614; and multi-component copolymers of alkyl acrylates, acrylonitrile or methacrylonitrile and unsaturated carboxylic acids as disclosed in, for instance, J.P. KOKAI Sho 56-4144. Examples thereof further include acidic polyvinyl alcohol derivatives and acidic cellulose derivatives. Examples of such light-insensitive resins useful in the present invention likewise include "alkaline aqueous solution-soluble polymer compounds" as will be detailed later in the explanation of the thermally cross-linkable light-sensitive composition. Examples of such resins also include binders disclosed in, for instance, J.P. KOKOKU Sho 54-19773 and J.P. KOKAI Nos. Sho 57-94747, Sho 60-182437, Sho 62-58242 and Sho 62-123453, which are obtained by making polyvinyl acetals and polyurethanes soluble in an alkali solution, with resins obtained by making polyurethanes soluble in an alkali solution being particularly preferred in the invention because of their high film strength.

The light-insensitive resin composition can be dissolved in a variety of known coating solvents, applied onto an aluminum substrate having a hydrophilic surface and a primer coating layer in an amount, as determined after drying, ranging from 0.2 to 3.0 g/m$^2$ and preferably 0.3 to 1.5 g/m$^2$, and then dried to give an original plate for making a dummy plate used for the lithographic printing plate. In this respect, if the coated amount of the composition is less than 0.2 g/m$^2$, the resulting original plate is insufficient in the ability of preventing occurrence of any damage, while if it exceeds 3.0 g/m$^2$, the resulting original plate is sufficient in the ability of preventing occurrence of any damage, but the resulting light-insensitive layer has a low rate of dissolution when the film is removed through the dissolution thereof and reduces the processing capacity of the dissolving solution. The solid content of the coating solution containing the light-insensitive resin composition upon the practical coating suitably ranges from 1.0 to 50% by weight and preferably 2.0 to 30% by weight. Examples of methods usable herein for applying the resin composition onto the substrate are any conventionally known method such as roll coating, bar coating, spray coating, curtain coating or whirler coating methods. The coated solution containing the resin composition is preferably dried at a temperature ranging from 50 to 150° C. The coated solution may be dried by first preliminarily drying at a low temperature and then drying at a high temperature or it may directly be dried at a high temperature.

The light-insensitive resin layer may comprise a coloring agent such as a dyestuff, a pigment or a dye for the discrimination of the coated layer. Examples of such coloring agents are pigments such as phthalocyanine pigments (C.I. Pigment Blue 15:3, 15:4 and 15:6), azo pigments, carbon black and titanium oxide, Ethyl Violet, Crystal Violet, Victoria Pure Blue, azo dyes, anthraquinone dyes and cyanine dyes. The added amount of the coloring agent preferably ranges from about 0.01 to about 20% and more preferably 0.1% to 10% on the basis of the total amount of the composition.

The light-insensitive resin layer may further comprise various kinds of additives, for instance, a plasticizer or a low molecular weight acid compound for promoting the dissolution thereof and an agent for improving the quality of the coated surface such as a fluorine atom-containing surfactant. Particularly preferred are low molecular weight acid compounds containing carboxylic acid or sulfonic acid residues such as di-picolinic acid, malic acid, sulfo-salicylic acid, sulfo-phthalic acid and tricarballylic acid since they have a dissolution-promoting effect and an image-staining-inhibitory effect when storing the same over a long period of time. Moreover, the fluorine atom-containing surfactant is also preferably used herein since it not only has an excellent ability of improving the coated surface quality, but also is effective for enhancing the ability of preventing the occurrence of any damage. The light-insensitive resin layer may comprise such a low molecular weight acid compound in an amount ranging from 1 to 20% by weight and such a fluorine atom-containing surfactant in an amount ranging from 0.1 to 5% by weight on the basis of the total mass of the resin layer.

The aluminum substrate having a hydrophilic surface may be one identical to that used in the light-sensitive lithographic printing plate as will be detailed later.

Then the arbitrarily applied primer coating layer will be described in detail below. Examples of water-soluble compounds used in the primer coating layer are carboxy-methyl cellulose, dextrin, gum Arabic, amino group-containing phosphonic acids such as 2-aminomethyl phosphonic acid, substituted or unsubstituted organic phosphonic acids such as phenyl phosphonic acid, naphthyl phosphonic acid, alkyl phosphonic acid, glycerol-phosphonic acid, methylene di-phosphonic acid and ethylene di-phosphonic acid, substituted or unsubstituted organic phosphoric acids such as phenyl phosphoric acid, naphthyl phosphoric acid, alkyl phosphoric acid and glycerol-phosphoric acid, substituted or unsubstituted organic phosphinic acids such as phenyl phosphinic acid, naphthyl phosphinic acid, alkyl phosphinic acid and glycerol-phosphinic acid, amino acids such as glycine and β-alanine, hydrochlorides of amines having hydroxyl groups such as triethanolamine hydrochloride, and water-soluble polymers carrying sulfonic acid residues, with the water-soluble polymers carrying sulfonic acid residues being particularly preferred in the invention.

The water-soluble polymer carrying sulfonic acid residues is a water-soluble polymer compound comprising, in the molecule, at least one monomer carrying a sulfonic acid residue as a repeating unit thereof and examples thereof are those disclosed in J.P. KOKOKU Hei 4-9296 (in the passage extending from the third column, line 22 to the fourth column, line 41). The monomer carrying a sulfonic acid residue preferably used herein may, for instance, be p-styrene sulfonic acid, 2-acrylamide-2-methyl-propane sulfonic acid and ethylene-sulfonic acid, one or at least two of which may appropriately be polymerized or copolymerized with other monomers. If the foregoing monomers are copolymerized with other monomers, such other monomers are not restricted to specific ones inasmuch as they are copolymerizable with the sulfonic acid residue-containing monomers. Specific examples thereof are methyl methacrylate/ethyl acrylate/sodium 2-acrylamide-2-methylpropane sulfonate, methyl methacrylate/methyl acrylate/sodium p-styrene sulfonate and sodium polystyrene-sulfonate. The molecular weight of these water-soluble polymer compounds is not restricted to any specific range inasmuch as it is water-soluble, but it may suitably be in the range of from 1000 to 1,000,000, preferably 2,000 to 100,000 and most preferably 10,000 to 100,000 as expressed in terms of the weight average molecular weight as a general standard.

This primer coating layer may be formed by dissolving the foregoing compound in water, methanol, ethanol, isopropyl alcohol, methyl ethyl ketone or a mixture thereof, applying the resulting solution onto a substrate and then drying. The coated amount of the primer coating layer after drying suitably ranges from 10 to 500 mg/m$^2$ and preferably 50 to 200 mg/m$^2$. In this connection, if the amount of the primer coating layer is less than 10 mg/m$^2$, the resulting layer is insufficient in the image-staining preventing ability. On the other hand, if it exceeds 500 mg/m$^2$, the film strength of the subsequently applied light-insensitive resin layer is reduced and therefore, the film in turn has a low ability of preventing the occurrence of any damage upon handling the same.

Light-Sensitive Lithographic Printing Plate

The light-sensitive lithographic printing plate used in the present invention may be a conventional negative type one whose light-sensitive layer undergoes a physical property change through exposure to light or in which the light-sensitive layer initially soluble in a developer is converted into one insoluble in the developer, or a conventional positive type one in which the light-sensitive layer initially insoluble in a developer is converted into one soluble in the developer; photopolymerizable light-sensitive lithographic printing plates, which make use of an optical reaction as the principle of the physical property change; those making use of a heat mode process as the principle of the physical property change; and thermally cross-linkable light-sensitive lithographic printing plates. Among them, suitably used herein as light-sensitive plates for making lithographic printing plates are the foregoing two kinds of plates, that is, photopolymerizable light-sensitive lithographic printing plates and thermally cross-linkable light-sensitive lithographic printing plates.

The photopolymerizable light-sensitive lithographic printing plates and thermally cross-linkable light-sensitive lithographic printing plates will be described below in detail.

Photopolymerizable Light-Sensitive Lithographic Printing Plates

The "photopolymerizable light-sensitive lithographic printing plate" used in the present invention comprises an aluminum substrate having a hydrophilic surface as will be described below provided thereon with a photopolymerizable light-sensitive layer. The photopolymerizable light-sensitive composition constituting the light-sensitive layer thereof comprises, as essential components, an addition polymerizable ethylenically unsaturated compound, a photopolymerization initiator and a polymer binder and simultaneously comprises, if necessary, various kinds of compounds (or additives) such as a coloring agent, a plasticizer and/or a heat polymerization inhibitor.

<Photopolymerizable Light-Sensitive Composition>
(a) Addition Polymerizable Ethylenically Unsaturated Compound The addition polymerizable ethylenically unsaturated compound is herein defined to be a compound having an ethylenically unsaturated bond, which can undergo an addition polymerization, cross-linking or curing reaction through the action of a photopolymerization initiator when the composition is irradiated with actinic light rays.

The addition polymerizable ethylenically unsaturated bond-containing compound may arbitrarily be selected from compounds having at least one and preferably at least two terminal ethylenically unsaturated bonds. Such a compound may be in a chemical form such as a monomer; a prepolymer or a dimer, a trimer or an oligomer; a mixture thereof; or a copolymer.

Examples of monomers and copolymers thereof are esters of unsaturated carboxylic acids (such as acrylic acid, methacrylic acid, itaconic acid, crotonic acid, isocrotonic acid and maleic acid) with aliphatic polyhydric alcohol compounds and amides of unsaturated carboxylic acids with aliphatic polyvalent amine compounds.

Specific examples of such ester monomers of unsaturated carboxylic acids with aliphatic polyhydric alcohol compounds are acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylol-propane triacrylate, trimethylol-propane tri(acryloyloxy-propyl) ether, trimethylol-ethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, di-pentaerythritol diacrylate, di-pentaerythritol pentaacrylate, di-pentaerythritol hexaacrylate, sorbitol acrylate, sorbitol tetraacrylate, sorbitol pentaacrylate, sorbitol hexaacrylate, tri(acryloyloxy-ethyl) isocyanurate and polyester acrylate oligomers.

Specific examples of methacrylic acid esters are tetramethylene glycol di-methacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, penta-erythritol dimethacrylate, pentaerythritol trimethacrylate, pentaerythritol tetra-methacrylate, dipentaerythritol dimethacrylate, dipentaerythritol hexamethacrylate, dipentaerythritol pentamethacrylate, sorbitol trimethacrylate, sorbitol tetra-methacrylate, bis[p-(3-methacryloxy-2-hydroxypropoxy) phenyl] dimethyl-methane and bis [p-(methacryloxy-ethoxy) phenyl] dimethyl-methane.

Examples of itaconic acid esters are ethylene glycol di-itaconate, propylene glycol di-itaconate, 1,3-butanediol di-itaconate, 1,4-butanediol di-itaconate, tetramethylene glycol di-itaconate, pentaerythritol di-itaconate and sorbitol tetra-itaconate.

Examples of crotonic acid esters are ethylene glycol di-crotonate, tetramethylene glycol di-crotonate, pentaerythritol di-crotonate and sorbitol tetra-crotonate.

Examples of isocrotonic acid esters are ethylene glycol di-isocrotonate and pentaerythritol di-isocrotonate.

Examples of maleic acid esters are ethylene glycol di-maleate, triethylene glycol di-maleate, pentaerythritol di-maleate and sorbitol tetra-maleate.

In addition, examples of monomers also include mixtures of the foregoing ester monomers.

Specific examples of amide monomers of aliphatic polyvalent amine compounds with unsaturated carboxylic acids are methylene-bis-acrylamide, methylene-bis-methacrylamide, 1,6-hexamethylene-bis-acrylamide, 1,6-hexamethylene-bis-methacryl-amide, diethylene-triamine trisacrylamide, xylylene-bis-acrylamide and xylylene-bis-methacrylamide.

Examples of other monomers are vinyl urethane compounds each comprising, in the molecule, at least two polymerizable vinyl groups obtained by adding hydroxyl group-containing vinyl monomers represented by the following general formula (A) to poly-isocyanate compounds each having, in the molecule, at least two isocyanate groups, such as those disclosed in J.P. KOKOKU Sho 48-41708:

$$CH_2=C(R^5)COOCH_2CH(R^6)OH \quad\quad (A)$$

Wherein $R^5$ and $R^6$ each represents a hydrogen atom or a methyl group.

Moreover, examples of such addition polymerizable ethylenically unsaturated bond-containing compounds also include urethane acrylates disclosed in J.P. KOKAI Sho 51-37193 and J.P. KOKOKU Hei 2-32293; polyester acrylates disclosed in J.P. KOKAI Sho 48-64183 and J.P. KOKOKU Nos. Sho 49-43191 and Sho 52-30490; and polyfunctional acrylates and methacrylates such as epoxy acrylates obtained by reacting epoxy resins with (meth) acrylic acid. Examples of such compounds usable herein include those introduced as optically curable monomers and oligomers in Bulletin of Adhesive Society in Japan, Vol. 20, No. 7, pp. 300–308, 1984.

In this respect, the amount of these ethylenically unsaturated compounds ranges from 5 to 80% by weight and preferably 30 to 70% by weight on the basis of the total mass of the light-sensitive layer.

(b) Photopolymerization Initiator

The photopolymerization initiator to be added to the light-sensitive layer of the photopolymerizable light-sensitive lithographic printing plate may be selected from various kinds of known photo-initiators disclosed in patents and literature and systems simultaneously comprising at least two photo-initiators (photo-initiator system) depending on the wavelength of a light source used. Specific examples thereof will be described below, but the present invention is not limited to the specific examples at all.

There have been proposed a variety of photo-initiators even when using light sources such as those emitting visible light rays having a wavelength of not less than 400 nm, Ar lasers, semiconductor lasers (secondary higher harmonic waves) or SHG-YAG Laser and specific examples thereof are certain optically reducible dyes disclosed in U.S. Pat. No. 2,850,445 such as Rose Bengale, Eosine and Erythrosine; systems comprising dyes and initiators such as composite initiator systems comprising dyes and amines (J.P. KOKOKU Sho 44-20189); systems simultaneously comprising hexa-aryl bi-imidazoles, radical generators and dyes (J.P. KOKOKU Sho 45-37377); systems comprising hexa-aryl bi-imidazoles and p-dialkylamino-benzylidene ketones (J. P. KOKOKU Sho 47-2528 and J.P. KOKAI Sho 54-155292); systems comprising cyclic cis-α-dicarbonyl compounds and dyes (J.P. KOKAI Sho 48-84183); systems comprising cyclic triazines and merocyanine dyes (J.P. KOKAI Sho 54-151024); systems comprising 3-ketocoumarin and activators (J.P. KOKAI Nos. Sho 52-112681 and Sho 58-15503); systems comprising bi-imidazoles, styrene derivatives and thiols (J.P. KOKAI Sho 59-140203); systems comprising organic peroxide compounds and dyes (J.P. KOKAI Nos. Sho 59-1504, Sho 59-140203, Sho 59-189340 and Sho 62-174203, J.P. KOKOKU Sho 62-1641 and U.S. Pat. No. 4,766,055); systems comprising dyes and active halogen atom-containing compounds (J.P. KOKAI Nos. Sho 63-258903 and Hei 2-63054); systems comprising dyes and borate compounds (J.P. KOKAI Nos. Sho 62-143044, Sho 62-150242, Sho 64-13140, Sho 64-13141, Sho 64-13142, Sho 64-13143, Sho 64-13144, Sho 64-17048, Hei 1-229003, Hei 1-298348 and Hei 1-138204); systems comprising dyes having rhodanine rings and radical generators (J.P. KOKAI Nos. Hei 2-179643 and Hei 2-244050); systems comprising titanocene and 3-ketocoumarin dyes (J.P. KOKAI Sho 63-221110); systems comprising combinations of titanocene, xanthene dyes and addition polymerizable ethylenically unsaturated compounds (J.P. KOKAI Nos. Hei 4-221958 and Hei 4-219756); systems comprising titanocene and specific merocyanine dyes (J.P. KOKAI Hei 6-295061); and systems comprising titanocene and dyes carrying benzopyran rings (J.P. KOKAI Hei 8-334897).

Moreover, lasers emitting light rays having a wavelength ranging from 400 to 410 nm (violet lasers) have recently been developed and there have correspondingly been developed photo-initiator systems sensible for the laser beam and highly sensitive to light rays having a wavelength of not more than 450 nm. Such photo-initiators may likewise be used in the invention.

Examples thereof include cationic dye/borate systems (J.P. KOKAI Hei 11-84647); merocyanine dye/titanocene systems (J.P. KOKAI 2000-147763); and carbazole type dye/titanocene systems (Japanese Patent Application Hei 11-221480).

In the present invention, titanocene compound-containing systems are preferred among others because of their excellent sensitivity.

The titanocene compounds usable herein may be a variety of such compounds and appropriately selected from the group consisting of those disclosed in, for instance, J.P. KOKAI Nos. Sho 59-152396 and Sho 61-151197. Specific examples thereof are di-cyclopentadienyl-Ti-di-chloride, di-cyclopentadienyl-Ti-bis-phenyl, di-cyclopentadien-yl-Ti-bis-2,3,4,5,6-pentafluoro-phen-1-yl, di-cyclopentadienyl-Ti-bis-2,3,5,6-tetrafluoro-phen-1-yl, di-cyclopentadienyl-Ti-bis-2,4,6-trifluoro-phen-1-yl, di-cyclopentadienyl-Ti-bis-2,6-difluoro-phen-1-yl, di-cyclopentadienyl-Ti-bis-2,4-difluoro-phen-1-yl, di-methyl-cyclopentadienyl-Ti-bis-2,3,4,5,6-penta-fluoro-phen-1-yl, di-methyl-cyclopentadienyl-Ti-bis-2,6-difluoro-phen-1-yl and di-cyclopentadienyl-Ti-bis-2,6-difluoro-3-(pyr-1-yl)-phen-1-yl.

Moreover, it has been known that the photo-initiation ability of the foregoing photo-initiators can further be improved by the optional addition of a hydrogen atom-donating compound, for instance, a thiol compound such as 2-mercapto-benzothiazole, 2-mercapto-benzimidazole or 2-mercapto-benzoxazole; or an amine compound such as N-phenyl glycine or an N,N-dialkylamino aromatic alkyl ester to the photo-initiators.

(c) Infrared Absorbers

The infrared absorbers usable in the present invention are not limited to specific ones without any restriction in the wavelength range of the absorbed light, inasmuch as they are substances capable of generating heat through the absorption of irradiated light energy, but preferably used herein are, for instance, infrared-absorbing dyes or pigments whose peak absorbance exists at a wavelength ranging from 700 to 1200 nm from the viewpoint of the adaptability to easily available high output lasers.

Such dyes usable herein may be any commercially available dyes and known ones disclosed in, for instance, "Handbook of Dyes" (edited by Society of Organic Synthesis Chemistry, published in Showa 45 (1970)). Specific examples thereof are dyes such as azo dyes, metal complex azo dyes, pyrazolone azo dyes, naphthoquinone dyes, anthraquinone dyes, phthalocyanine dyes, naphthalocyanine dyes, carbonium dyes, quinone-imine dyes, methine dyes, cyanine dyes, squarylium dyestuff, (thio)-pyrylium salts, metal thiolate complexes, indoaniline metal complex dyes, oxonol dyes, di-imonium dyes, aminium dyes, croconium dyes and intermolecular CT dyestuffs.

Examples of dyes preferably used herein are cyanine dyes disclosed in, for instance, J.P. KOKAI Nos. Sho 58-125246, Sho 59-84356, Sho 59-202829 and Sho 60-78787; methine dyes disclosed in, for instance, J.P. KOKAI Nos. Sho 58-173696, Sho 58-181690 and Sho 58-194595; naphthoquinone dyes disclosed in, for instance, J.P. KOKAI Nos. Sho 58-112793, Sho 58-224793, Sho 59-48187, Sho 59-73996, Sho 60-52940 and Sho 60-63744; squarylium dyestuff disclosed in, for instance, J.P. KOKAI Sho 58-112792; and cyanine dyes disclosed in U.K. Patent No. 434,875.

Moreover, examples of infrared absorbers usable herein also include near infrared-absorbable sensitizing agents disclosed in U.S. Pat. No. 5,156,938; substituted aryl-benzo-(thio)-pyrylium salts disclosed in U.S. Pat. No. 3,881,924; tri-methine thia-pyrylium salts disclosed in J.P. KOKAI Sho 57-142645 (U.S. Pat. No. 4,327,169); pyrylium compounds disclosed in J.P. KOKAI Nos. Sho 58-181051, Sho 58-220143, Sho 59-41363, Sho 59-84248, Sho 59-84249, Sho 59-146063 and Sho 59-146061; cyanine dyestuffs disclosed in J.P. KOKAI Sho 59-216146; penta-methine thio-pyrylium salts disclosed in U.S. Pat. No. 4,283,475; and pyrylium compounds disclosed in J.P. KOKOKU Nos. Hei 5-13514 and Hei 5-19702.

Other examples of preferred dyes are near infrared-absorbable dyes represented by the general formulas (I) and (II) in U.S. Pat. No. 4,756,993.

Among these dyes, particularly preferred are cyanine dyestuffs, phthalocyanine dyes, oxonol dyes, squarylium dyestuff, pyrylium salts, thio-pyrylium dyes and nickel thiolate complexes.

(d) Initiators

The radical generator used in the present invention is a compound, which can generate radicals by the action of either or both of light rays and heat to thus initiate and promote the polymerization of compounds having polymerizable unsaturated group. The radical generators usable herein may be, for instance, known heat polymerization initiators; compounds having bonds whose bonding-dissociation energy is low; and photopolymerization initiators. The radical generators suitably used in the present invention may be compounds capable of generating radicals by the action of heat energy to thus initiate and promote the polymerization of compounds having polymerizable unsaturated group. The radical generator used in the invention may appropriately be selected from known polymerization initiators and compounds having bonds whose bonding-dissociation energy is low. Moreover, these radical generators may be used in the present invention alone or in any combination of at least two of them.

Examples of compounds capable of generating radicals are organic halogen atom-containing compounds, carbonyl compounds, organic peroxide compounds, azo type polymerization initiators, azide compounds, metallocene compounds, hexa-aryl-bi-imidazole compounds, organic boron-containing compounds, di-sulfonic acid compounds and onium salt compounds.

The amount of these photopolymerization initiators (systems) to be incorporated into the composition ranges from 0.05 to 100 parts by weight, preferably 0.1 to 70 parts by weight and more preferably 0.2 to 50 parts by weight per 100 parts by weight of the ethylenically unsaturated compound.

(e) Polymer Binders

The polymer binder used in the light-sensitive layer of a photopolymerizable light-sensitive lithographic printing plate may suitably be an organic high molecular weight polymer soluble in or swellable with an alkaline water since the binder should serve as a film-forming agent in the composition and must be soluble in an alkali developer.

If a water-soluble organic high molecular weight polymer is, for instance, used as such an organic high molecular weight polymer, the resulting light-sensitive layer can be developed with water. Examples of such organic high molecular weight polymers are addition polymers having carboxylic acid residues on the side chains thereof, for instance, those disclosed in J.P. KOKAI Nos. Sho 59-44615, Sho 54-92723, Sho 59-53836 and Sho 59-71048 and J.P. KOKOKU Nos. Sho 54-34327, Sho 58-12577 and Sho 54-25957, or methacrylic acid copolymers, acrylic acid copolymers, itaconic acid copolymers, crotonic acid copolymers, maleic acid copolymers and partially esterified maleic acid copolymers.

Examples of polymer binders usable herein also include acidic cellulose derivatives carrying, on the side chains, carboxylic acid residues and those obtained by adding cyclic acid anhydrides to addition polymers having hydroxyl groups. Among these, preferred are [benzyl (meth)acrylate/(meth)acrylic acid/optional other addition polymerizable vinyl monomers] copolymers and [allyl (meth)acrylate/(meth)acrylic acid/optional other addition polymerizable vinyl monomers] copolymers.

Examples of other water-soluble organic polymers useful in the invention are polyvinyl pyrrolidones and polyethylene oxides. Examples of such polymers useful in the invention also include alcohol-soluble polyamides and polyethers of 2,2-bis-(4-hydroxyphenyl)-propane with epichlorohydrin for the improvement of the strength of the resulting cured film.

Examples of polymer binders useful for the applications of the present invention also include polyurethane resins disclosed in, for instance, J.P. KOKOKU Nos. Hei 7-120040, Hei 7-120041, Hei 7-120042 and Hei 8-12424 and J.P. KOKAI Nos. Sho 63-287944, Sho 63-287947, Hei 1-271741 and Hei 11-352691.

Groups having an ability of undergoing a radical reaction may be introduced into these high molecular weight polymers to thus improve the strength of the resulting cured film. Examples of such groups include addition polymerizable functional groups such as ethylenically unsaturated bond-containing groups, amino groups and epoxy groups; functional groups capable of generating radicals through the irradiation with light rays such as mercapto groups, thiol groups, halogen atoms, triazine structures and onium salt structures; and polar groups such as carboxyl groups and imide groups. Particularly preferred addition polymerizable functional groups are, for instance, ethylenically unsaturated bond-containing groups such as acryl groups, methacryl groups, allyl groups and styryl groups, but useful herein also include functional groups selected from the group consisting of amino groups, hydroxyl groups, phosphonic acid residues, phosphoric acid residues, carbamoyl groups, isocyanate groups, ureido groups, ureylene groups, sulfonic acid residues and ammonio groups.

The polymer binder preferably has an appropriate molecular weight and a reasonable acid value in order to maintain the developing ability of the composition and the binder effectively used herein has a weight average molecular weight ranging from 5,000 to 300,000 and an acid value ranging from 20 to 200.

These organic high molecular weight polymers may be incorporated into the composition in any amount. However, the use of such a polymer in an amount of higher than 90% by weight never provides preferred results with respect to, for instance, the strength of images formed. Therefore, the amount preferably ranges from 10 to 90% by weight and more preferably 30 to 80% by weight. Moreover, the weight ratio: (photopolymelizable ethylenically unsaturated compound)/(organic high molecular weight polymer) preferably ranges from 1/9 to 9/1, more preferably 2/8 to 8/2 and most preferably 3/7 to 7/3.

(f) Other Additives

Moreover, in the present invention, it is preferred to add a small amount of a heat polymerization inhibitor to the photopolymerizable light-sensitive composition in addition to the foregoing essential components in order to prevent any undesirable heat polymerization of the polymerizable ethylenically unsaturated compound during the preparation of the composition or during the storage thereof. Examples of such heat polymerization inhibitors suitably used in the invention are hydroquinone, p-methoxy-phenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), N-nitrosophenyl hydroxylamine cerous salt and N-nitrosophenyl hydroxylamine aluminum salt. The amount of the heat polymerization inhibitor to be added preferably ranges from about 0.01 to about 5% by weight on the basis of the total mass of the composition. Moreover, a higher fatty acid derivative such as behenic acid and behenic acid amide may be added to the composition to eliminate any polymerization-inhibitory effect of oxygen. The higher fatty acid derivative may locally be distributed in the surface of the light-sensitive layer during the drying step after the application thereof. The amount of the higher fatty acid derivative preferably ranges from about 0.5 to about 10% by weight on the basis of the total mass of the composition.

In addition, a coloring agent may be added to the light-sensitive layer to color the layer. Examples of such coloring agents include pigments, for instance, phthalocyanine pigments (such as C.I. Pigment Blue 15:3, 15:4, 15:6), azo pigments, carbon black and titanium oxide; and dyes such as Ethyl Violet, Crystal Violet, azo dyes, anthraquinone dyes and cyanine dyes. The amount of the dyes or pigments preferably ranges from about 0.5% to about 20% by weight on the basis of the total mass of the light-sensitive composition.

Additionally, in order to improve the physical properties of the cured film, additives such as an inorganic filler and/or a plasticizer such as dioctyl phthalate, dimethyl phthalate and tricresyl phosphate, can be added.

The amount of these additives is preferably not more than 10% by weight based on the total mass of the light-sensitive composition.

The foregoing photopolymerizable light-sensitive composition is dissolved in a variety of organic solvents prior to the application thereof onto the surface of a substrate. Examples of such organic solvents usable herein include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone-alcohol, ethylene glycol monomethyl ether acetate, ethylene glycol ethyl ether acetate, ethylene glycol mono-isopropyl ether, ethylene glycol monobutyl ether acetate, 3-methoxypropanol, methoxymethoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate-3-methoxypropyl acetate, N,N-dimethylformamide, dimethylsulfoxide, γ-butyrolactone, methyl lactate and ethyl lactate. These solvents can be used alone or in any combination thereof. The solid content in the coating solution suitably ranges from 1 to 50% by weight.

The foregoing photopolymerizable light-sensitive composition may further comprise a surfactant to improve the surface quality of the coated film. The amount of the surfactant in the light-sensitive layer suitably ranges from 0.3 to 5.0 g/m$^2$, and preferably 0.5 to 3 g/m$^2$, based on the mass of the dried light-sensitive layer.

[Protective Layer having Oxygen-Barrier Property]

In general, a protective layer having oxygen-barrier properties is preferably applied onto the foregoing light-sensitive layer in order to eliminate the polymerization-inhibitory action of oxygen.

Examples of water-soluble vinyl polymers to be incorporated into such a protective layer having oxygen-barrier properties include polyvinyl alcohol and partial esters, ethers or acetals thereof, and copolymers thereof each comprising a substantial amount of unsubstituted vinyl alcohol units that make the compounds water-soluble. Examples of such polyvinyl alcohol include polyvinyl alcohols, 71% to 100% of which is hydrolyzed and having a degree of polymerization ranging from 300 to 2400. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-224, PVA-217E, PVA-220E, PVA-224E, PVA-405, PVA-420, PVA-613 and L-8 (available from Kuraray Co. Ltd.). Examples of such copolymers include polyvinyl acetate-chloroacetate or -propionate, polyvinyl formal and polyvinyl acetal, and copolymers thereof, 88% to 100% of which is hydrolyzed. In addition, examples of other useful polymers for obtaining the protective layer include polyvinyl pyrrolidone, gelatin and gum Arabic. These polymers can be used alone or in any combination.

In the preparation of the photopolymerizable light-sensitive lithographic printing plate of the present invention, a solvent to be used for coating the protective layer having oxygen-barrier properties is preferably pure water, but it may likewise be a blend of pure water and an alcohol such as methanol or ethanol and/or a ketone such as acetone or methyl ethyl ketone. The solid content in the coating solution suitably ranges from 1 to 20% by weight.

In addition, the protective layer having oxygen-barrier properties may comprise known additives such as a surfactant for the improvement of the coating characteristics of the layer and a water-soluble plasticizer for the improvement of physical properties of the resulting film.

Examples of such water-soluble plasticizers are propionamide, cyclohexane-diol, glycerin and sorbitol. A water-soluble (meth)acrylic polymer may likewise be added to the protective layer.

The amount of these additives after being dried suitably ranges from 0.5 to 10 g/m$^2$ and more preferably about 1.0 to about 5.0 g/m$^2$.

[Substrate]

Then the substrate used for making a photopolymerizable light-sensitive lithographic printing plate will hereunder be described in detail.

The foregoing light-sensitive layer is applied onto a substrate having a hydrophilic surface to thus give a photopolymerizable light-sensitive lithographic printing plate. Such a hydrophilic substrate may be any conventionally known hydrophilic substrate used for making lithographic printing plates without any limitation. The substrate used herein is preferably a dimensionally stable plate-like material and examples thereof are paper, paper laminated with plastic (such as polyethylene, polypropylene, polystyrene), metal plates (such as aluminum, zinc and copper plates), plastic films (such as cellulose di-acetate, cellulose tri-acetate, cellulose propionate, cellulose butyrate, cellulose acetate butyrate, cellulose nitrate, polyethylene terephthalate, polyethylene, polystyrene, polypropylene, polycarbonate and polyvinyl acetal films), paper or plastic films, which are laminated with the foregoing metals or on which the foregoing metals are deposited. These materials may, if necessary, be subjected to known appropriate physical and/or chemical treatments for the purpose of the impartment of hydrophilicity to the surface thereof and the improvement of the strength.

Particularly preferred substrates are, for instance, paper, polyester films or aluminum plates. Among these, aluminum plates are particularly preferred since they are dimensionally stable, relatively cheap and they can provide the desired surface excellent in hydrophilicity and strength when, if needed, subjecting them to surface treatments. In addition, preferably used herein also include composite sheets each comprising a polyethylene terephthalate film laminated with an aluminum sheet, such as those disclosed in J.P. KOKOKU Sho 48-18327.

The aluminum plates suitably used herein are a pure aluminum plate and plates of alloys mainly comprising aluminum and trace amounts of foreign elements as well as plastic films laminated with aluminum or on which aluminum is deposited. Foreign elements included in aluminum alloys are, for instance, silicon, iron, manganese, copper, magnesium, chromium, zinc, bismuth, nickel and titanium. The content of these foreign elements in the alloy is at most 10% by weight. The aluminum particularly preferably used in the invention is pure aluminum, but it is impossible to obtain completely pure aluminum because of the limit in the refining technique and therefore, the aluminum used herein may comprise a trace amount of foreign elements. As has been discussed above, the aluminum plate used herein is not limited in its composition and the aluminum plates made of materials conventionally known and currently used may appropriately be used. The aluminum plate used herein has a thickness suitably ranging from 0.1 to 0.6 mm, preferably 0.15 to 0.4 mm and particularly preferably 0.2 to 0.3 mm.

Moreover, when using, in particular, a substrate having an aluminum surface, it is preferred that the substrate is subjected to surface treatments such as a surface-roughening (surface-graining) treatment and a treatment by dipping in an aqueous solution of sodium silicate, potassium fluorozirconate or a phosphoric acid salt. The substrate is necessarily subjected to an anodization treatment to prevent any damage of non-image area on an original plate for making a lithographic printing plate after the development thereof and it is thus preferred to form an anodized layer in an amount preferably ranges from 0.5 to 5.0 $g/m^2$ and more preferably 1.0 to 4.0 $g/m^2$.

The surface-roughening of an aluminum plate may be conducted a variety of methods such as methods of mechanically roughening the surface, methods for roughening the surface of an aluminum plate by electrochemically dissolving the surface thereof and methods for selectively dissolving the surface of an aluminum plate through a chemical means. Examples of mechanical surface-roughening methods usable herein are ball graining, brush graining, blast graining and buff graining methods. Examples of electrochemical surface-roughening methods are those, which are carried out in an electrolyte such as hydrochloric acid or nitric acid solutions using an alternating or direct current. It is also possible to use methods comprising the combination of these methods as disclosed in J.P. KOKAI Sho 54-63902 In addition, such an aluminum plate is, if desired, degreased with, for instance, a surfactant, an organic solvent or an alkaline aqueous solution prior to the surface-roughening treatment for the purpose of the removal of any rolling oil possibly present on the surface thereof.

Moreover, preferably used herein include aluminum plates treated by dipping them in an aqueous sodium silicate solution after the surface-roughening treatment. Preferably used herein also include aluminum plates treated by dipping them in an aqueous alkali metal silicate solution after the anodization thereof. The anodization treatment is, for instance, conducted by passing an electric current through an aluminum plate serving as an anode in an electrolyte such as an aqueous or non-aqueous solution of an inorganic acid such as phosphoric acid, chromic acid, sulfuric acid or boric acid or an organic acid such as oxalic acid or sulfamic acid or a salt thereof. In this respect, the aqueous and non-aqueous solutions may be used alone or in any combination.

Moreover, the silicate electrodeposition as disclosed in U.S. Pat. No. 3,658,662 is also effective in the invention.

In addition, examples of substrates useful in the invention also include those subjected to electrolytic graining and disclosed in, for instance, J.P. KOKOKU Sho 46-27481 and J.P. KOKAI Nos. Sho 52-58602 and Sho 52-30503, which are further subjected to a surface treatment comprising the combination of the foregoing anodization and the treatment with sodium silicate.

Moreover, suitably used herein also include substrates subjected to mechanical surface-roughening, chemical etching, electrolytic graining, anodization and sodium silicate treatments in this order, such as those disclosed in J.P. KOKAI Sho 56-28893.

Moreover, suitably used herein likewise include substrates obtained by applying primer coating layers of a water-soluble resin such as polyvinyl phosphonic acid, a polymer or a copolymer having, on the side chains, sulfonic acid residues, polyacrylic acid, a water-soluble metal salt (such as zinc borate), a yellow dye or an amine salt, after carrying out these treatments.

Examples of substrates suitably used herein are those subjected to a sol-gel treatment and having functional groups capable of causing an addition reaction by radicals such as those disclosed in J.P. KOKAI Hei 7-159983.

Examples of other substrates preferably used herein are any substrate on which a water-resistant hydrophilic layer is formed as surface layer. Examples of such surface layers include layers comprising inorganic pigments and binders such as those disclosed in U.S. Pat. No. 3,055,295 and J.P. KOKAI Sho 56-13168; hydrophilic swellable layers as disclosed in J.P. KOKAI Hei 9-80744; sol-gel films comprising titanium oxide, polyvinyl alcohol and/or silicic acids such as those disclosed in TOKUHYO Hei 8-507727.

The substrate is subjected to these hydrophilization treatments not only for making the substrate surface hydrophilic, but also for preventing the occurrence of any harmful reaction of the photopolymerizable composition applied onto the surface and for the improvement of the adhesion between the substrate and the light-sensitive layer.

A photopolymerizable light-sensitive lithographic printing plate is formed by applying a light-sensitive layer comprising the foregoing photopolymerizable composition on the substrate described above, but an organic or inorganic primer coating layer may be formed on the substrate surface prior to the application of such a light-sensitive layer.

<Imagewise Exposure and Development>

In the plate-making method of the present invention, the foregoing light-sensitive layer formed on the photopolymerizable light-sensitive lithographic printing plate is imagewise exposed to conventionally known actinic light rays such as laser beams emitted from an He—Cd laser, Ar ion lasers (488, 514.5 nm), an FD-YAG laser (532 nm), an He—Ne laser (633 nm), semiconductor lasers (350 to 900 nm, in particular, 405, 830 and 860 nm) and a YAG laser (1064 nm) and then developed in an automatic developing machine to thus form images on the substrate surface.

The developer used in the developing tank of the automatic developing machine is not restricted to any specific one, but examples thereof preferably used herein are those disclosed in J.P. KOKOKU Sho 57-7427 and specific examples thereof preferably used herein include aqueous solutions of inorganic alkali agents such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate and aqueous ammonia and organic alkali agents such as monoethanolamine and diethanolamine. The concentration of such an alkaline aqueous solution in general ranges from 0.1 to 10% by weight and preferably 0.5 to 5% by weight.

Such an alkaline aqueous solution or a developer may further comprise, if necessary, small amounts of a surfactant and/or an organic solvent such as benzyl alcohol, 2-phenoxyethanol or 2-butoxyethanol. Examples of such alkaline aqueous solutions are those disclosed in U.S. Pat. Nos. 3,375,171 and 3,615,480.

Examples of developers also excellent include those disclosed in, for instance, J.P. KOKAI Nos. Sho 50-26601 and Sho 58-54341 and J.P. KOKOKU Nos. Sho 56-39464 and Sho 56-42860.

The development in a developing tank is carried out at a temperature ranging from 0 to 60° C. and preferably 15 to 40° C. according to the usual method, for instance, by rubbing an imagewise exposed lithographic printing plate with a brush while dipping the printing plate in a developer.

As has been described above, in the present invention, an emagewise exposed lithographic printing plate and an original plate for making a dummy plate are conveyed to the developer tank of an automatic developing machine to thus develop these plates and in this respect, the physical properties of the developer containing in the developing tank such as pH value may be maintained at appropriate conditions by changing the amounts of, for instance, water and a replenisher for developer to be supplemented depending on the throughput of these plates.

The photopolymerizable printing plate thus developed is then treated with washing water and a rinsing solution containing, for instance, a surfactant in a washing tank as disclosed in J.P. KOKAI Nos. Sho 54-8002, Sho 55-115045 and Sho 59-58431, thereafter subjected to a post-treatment with a desensitizing liquid containing gum Arabic and a starch derivative in a gumming tank and then dried in a heating zone. After the developing treatment, the entire surface of the resulting printing plate may be exposed to UV light rays for the improvement of the printing durability of the plate. In the post-treatment, the developed lithographic printing plate can be subjected to various combinations of these treatments.

Thermally Cross-Linkable Light-Sensitive Lithographic Printing Plate

The thermally cross-linkable light-sensitive lithographic printing plate used in the present invention comprises an aluminum substrate having a hydrophilic surface as will be detailed later and a thermally cross-linkable light-sensitive layer applied onto the surface of the substrate. A thermally cross-linkable light-sensitive composition constituting the light-sensitive layer at least comprises an alkaline solution-soluble polymer compound, an infrared-absorber, a compound capable of generating an acid by the action of light rays or heat and an agent for forming crosslinks by the action of an acid.

When irradiating the thermally cross-linkable light-sensitive layer with an infrared laser beam in the image-forming process, it effectively absorbs the laser beam due to the infrared absorber present in the laser-irradiated area and only the exposed area generates heat by accumulating the energy of the light thus absorbed to thus generate an acid The cross-linking agent coexisting in the exposed area causes a cross-linking reaction due to the acid thus generated and only the exposed area is made insoluble in an aqueous alkali solution, while the un-exposed area of the light-sensitive layer is removed through the development with the aqueous alkali solution to thus form an image.

<Thermally Cross-Linkable Light-Sensitive Composition>
(a) Alkaline Water-Soluble Polymer Compound The alkaline water-soluble polymer compound usable in the present invention may be, for instance, a novolak resin or a polymer having hydroxy-aryl groups on the side chains thereof. The foregoing novolak resins may be resins obtained by condensing phenols with aldehydes under acidic conditions. Among them, preferably used herein include, for instance, novolak resins obtained from phenols and formaldehyde, novolak resins prepared from m-cresol and formaldehyde, novolak resins obtained from p-cresol and formaldehyde, novolak resins obtained from o-cresol and formaldehyde, novolak resins obtained from octylphenol and formaldehyde, novolak resins obtained from mixed (m-/p-) cresol and formaldehyde, and novolak resins obtained from phenol/cresol mixtures (which may be m-, p-, o- or m-/p-, m-/o-, o-/p-mixtures) and formaldehyde.

The foregoing novolak resin preferably has a weight average molecular weight ranging from 800 to 200,000 and a number average molecular weight ranging from 400 to 60,000.

Moreover, the foregoing polymers each having hydroxy-aryl groups on the side chains thereof can likewise preferably be used in the present invention and the hydroxy-aryl group in the polymer may, for instance, be an aryl group having at least one OH group. Examples of such aryl groups are phenyl, naphthyl, anthracenyl and phenanthrenyl groups, with phenyl and naphthyl groups being preferred among others because of their easy availability and excellent physical properties.

Therefore, examples of preferred hydroxy-aryl groups include hydroxyphenyl groups, di-hydroxyphenyl groups, tri-hydroxyphenyl groups, tetra-hydroxyphenyl groups, hydroxynaphthyl groups and di-hydroxynaphthyl groups. These hydroxy-aryl groups may further be substituted with substituents such as halogen atoms, hydrocarbon groups having not more than 20 carbon atoms, alkoxy groups having not more than 20 carbon atoms and aryloxy groups having not more than 20 carbon atoms. The foregoing hydroxy-aryl group is linked to the main chain constituting the polymer in the form of pendants as side chains, but it may likewise be linked to the main chain through a connecting group or a spacer group.

Examples of polymers having hydroxy-aryl groups on the side chains usable in the present invention include, but are not limited to those described in, for instance, J.P. KOKAI 2000-284474 (Sections 42 to 59).

The polymer having hydroxy-aryl groups on the side chains preferably has a weight average molecular weight of not less than 4000 and more preferably 10,000 to 300,000 and preferably has a number average molecular weight of not less than 1000 and more preferably 2000 to 250,000. Moreover, the polymer preferably has a degree of polydispersion of not less than 1 and more preferably 1.1 to 10.

The polymer having hydroxy-aryl groups on the side chains may be a random polymer, a block polymer or a graft polymer, with the random polymer being preferably used herein among others.

In the present invention, the alkaline water-soluble polymer compounds may be used alone or in any combination of at least two of them. The amount of the polymer compound to be incorporated into the thermally cross-linkable light-sensitive composition ranges from 5 to 95% by weight, preferably 10 to 95% by weight and most preferably 20 to 90% by weight on the basis of the total mass of the solid content of the composition. This is because if the added amount of the alkaline water-soluble polymer compound is less than 5% by weight, the resulting recording layer is sometimes insufficient in the durability, while if it exceeds 95% by weight, it is often observed that any image is not formed on the recording layer.

(b) Infrared Absorbers

The infrared absorber serves to convert the absorbed infrared rays into heat and the heat thus generated in turn serves to decompose the compound (D) capable of generating an acid by the action of light or heat as will be detailed later to thus form an acid. The infrared absorbers usable in the present invention are preferably dyes or pigments capable of effectively absorbing infrared rays whose wavelength falls within the range of from 760 to 1200 nm and more preferably dyes or pigments capable of effectively absorbing infrared rays, which have a peak absorbance at a wavelength ranging from 760 to 1200 nm.

Examples of the foregoing dyes or pigments are those described in J.P. KOKAI 2000-284474 (Sections 64 to 70).

The content of the foregoing dyes or pigments in the thermally cross-linkable light-sensitive composition preferably ranges from 0.01 to 50% by weight, more preferably 0.1 to 10% by weight and most preferably 0.5 to 10% by weight for the dyes and 1.0 to 10% by weight for the pigments, on the basis of the total solid content of the composition. This is because if the content thereof is less than 0.01% by weight, the resulting light-sensitive layer often has a low sensitivity, while if it exceeds 50% by weight, non-image areas are often contaminated, when the resulting product is used as an original plate for making a lithographic printing plate. The dye or pigment may be added to a layer containing other components or a separate layer.

(c) Compounds Capable of Generating Acid by the Action of Light or Heat

In the present invention, the compound capable of generating an acid by the action of light or heat (hereunder also referred to as "acid-generator") means a compound generating an acid when irradiating it with light rays whose wavelength falls within the range of from 200 to 500 nm or heating the same to a temperature of not less than 100° C.

Examples of such acid generators include photo-initiator for optical cationic polymerization, photo-initiator for optical radical polymerization, an optical achromatizing agent for dyestuffs, an optical color-changing agent, known acid generators used in micro-resists, known compounds capable of generating acids through thermal decomposition and mixtures thereof.

Specific examples thereof are acid generators disclosed in, for instance, J.P. KOKAI 2000-284474 (Sections 74 to 137).

The amount of the acid generator to be incorporated into the thermally cross-linkable light-sensitive composition preferably ranges from 0.01 to 50% by weight, more preferably 0.1 to 25% by weight and most preferably 0.5 to 20% by weight on the basis of the total solid content of the composition. This is because if the content thereof is less than 0.01% by weight, it is often observed that any image is not formed on the recording layer, while if it exceeds 50% by weight, non-image areas are often contaminated, when the resulting product is used as an original plate for making a lithographic printing plate. The foregoing acid generators may be used alone or in any combination of at least two of them.

(d) Cross-linking Agents Capable of Undergoing Cross-Linking by the Action of Acids Then the cross-linking agent capable of undergoing cross-linking by the action of an acid (hereunder simply referred to as "cross-linking agent") will be described in detail below. Examples of the foregoing cross-linking agents are those listed below:

(i) Aromatic compounds substituted with hydroxymethyl groups or alkoxymethyl groups;
(ii) Compounds having N-hydroxymethyl groups, N-alkoxymethyl groups or N-acyloxy-methyl groups; and
(iii) Epoxy compounds.

The foregoing compounds (i) to (iii) will hereunder be described in more detail. Examples of the foregoing aromatic compounds substituted with hydroxymethyl groups or alkoxymethyl groups include aromatic and heterocyclic compounds multi-substituted with hydroxymethyl groups, acetoxy-methyl groups or alkoxymethyl groups. In this respect, however, the aromatic compounds of this type do not include resinous compounds known as resol resins prepared by poly-condensing phenols and aldehydes under basic conditions. The resol resins are not preferably used herein for the following reasons: they are excellent in the cross-linking ability, but insufficient in heat stability and in particular, when they are incorporated into light-sensitive plates and the resulting plates are stored under high temperature conditions over a long period of time, it is not impossible to uniformly develop the plates.

(i) Specific examples of the aromatic compounds substituted with hydroxymethyl groups or alkoxymethyl groups are compounds disclosed in, for instance, J.P. KOKAI 2000-284474 (Sections 141 to 144).

(ii) Examples of the compounds having N-hydroxymethyl groups, N-alkoxymethyl groups or N-acyloxy-methyl groups include monomer and oligomer-melamine-formaldehyde condensation products as well as urea-formaldehyde condensation products disclosed in European Patent Laid-Open (hereunder referred to as "EP-A") No. 0,133,216 and German Patent Nos. 3,634,671 and 3,711,264, and alkoxy-substituted compounds disclosed in EP-A No. 0,212,482. Among them, preferred are melamine-formaldehyde derivatives each having at least two free N-hydroxymethyl groups, N-alkoxymethyl groups or N-acyloxy-methyl groups, with N-alkoxymethyl derivatives being most preferred.

(iii) Examples of epoxy compounds are epoxy compounds each having at least one epoxy group in the form of monomers, dimmers, oligomers and polymers and specific examples thereof are reaction products of bisphenol A and epichlorohydrin, and reaction products of low molecular weight phenol-formaldehyde resins with epichlorohydrin. In addition, examples of such epoxy compounds further include epoxy resins disclosed and used in U.S. Pat. No. 4,026,705 and G.B. Patent No. 1,539,192.

When the foregoing compounds (i) to (iii) are used as cross-linking agents, the amount thereof to be added to the thermally cross-linkable light-sensitive composition preferably ranges from 5 to 80% by weight, more preferably 10 to 75% by weight and most preferably 20 to 70% by weight on the basis of the total solid content of the composition. This is because if the added amount of the compound is less than 5% by weight, the resulting light-sensitive layer is insufficient in the durability, while if it exceeds 80% by weight, the storage stability of the resulting product is often reduced.

In the present invention, (iv) phenol derivatives represented by the following general formula (5) may suitably be used as cross-linking agents.

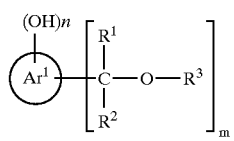

general formula (5)

In the foregoing general formula (5), $Ar^1$ represents a substituted or unsubstituted aromatic hydrocarbon ring. Examples of the foregoing aromatic hydrocarbon rings are benzene rings, naphthalene rings or anthracene rings from the viewpoint of easy availability of the raw materials therefor. In addition, examples of substituents of these rings preferably used herein are halogen atoms, hydrocarbon groups having not more than 12 carbon atoms, alkoxy groups having not more than 12 carbon atoms, alkylthio groups having not more than 12 carbon atoms, cyano groups, nitro groups and trifluoromethyl group. Among the foregoing, benzene or naphthalene ring free of any substituent, or benzene or naphthalene rings carrying a substituent or substituents selected from halogen atoms, hydrocarbon groups having not more than 6 carbon atoms, alkoxy groups having not more than 6 carbon atoms, alkylthio groups having not more than 6 carbon atoms or nitro groups are more preferably used as $Ar^1$, since they would permit the preparation of a highly sensitive light-sensitive layer.

In the foregoing general formula (5), $R^1$ and $R^2$ may be identical to or different from one another and each represents a hydrogen atom or a hydrocarbon group having not more than 12 carbon atoms, with a hydrogen atom or a methyl group being preferred among others because such compound may easily be synthesized. In addition, $R^3$ represents a hydrogen atom or a hydrocarbon group having not more than 12 carbon atoms and preferably selected herein include hydrocarbon groups having not more than 7 carbon atoms such as methyl, ethyl, propyl, cyclohexyl and benzyl groups since they would permit the preparation of a highly sensitive light-sensitive layer. Moreover, m is an integer ranging from 2 to 4 and n is an integer ranging from 1 to 3.

Specific examples of the phenol derivatives represented by the foregoing general formula (5) include compounds disclosed in, for instance, J.P. KOKAI 2000-284474 (Sections 152 to 158).

The phenol derivatives listed above may be used alone or in any combination of at least two of them. In the synthesis of the phenol derivative, phenol derivatives are sometimes condensed together to thus form impurities or by-products such as dimmers and trimers, but these phenol derivatives may be used without removing such impurities in the present invention. Incidentally, the content of the foregoing impurities is preferably not more than 30% by weight and more preferably not more than 20% by weight on the basis of the total mass of the derivative.

The amount of the phenol derivative to be incorporated into the thermally cross-linkable light-sensitive composition preferably ranges from 5 to 70% by weight and more preferably 10 to 50% by weight on the basis of the total solid content of the composition. This is because if the added amount of the derivative is less than 5% by weight, when an image is recorded on the resulting light-sensitive layer, the film on the image area may have insufficient strength, while if it exceeds 70% by weight, the storage stability of the resulting light-sensitive plate is deteriorated.

(e) Other Components

In the present invention, the thermally cross-linkable light-sensitive composition may, if necessary, comprise a variety of compounds as will be detailed below in addition to the foregoing components. For instance, a dye having a large absorbance at a wavelength falling within the visible region can be used as a coloring agent of images. Examples of such coloring agents are Oil Yellow #101, Oil Yellow #103, Oil Pink #321, Oil Green BG, Oil Blue BOS, Oil Blue #603, Oil Black BY, Oil Black BS, Oil Black T-505 (all of these coloring agents are available from ORIENT Chemical Industry Co., Ltd.); Victoria Pure Blue, Crystal Violet (CI 42555), Methyl Violet (CI 42535), Ethyl Violet, Rhodamine B (CI 1451170B), Malachite Green (CI 42000), Methylene Blue (CI 52015); and dyes disclosed in J.P. KOKAI Sho 62-293247.

These dyes are preferably added to the thermally cross-linkable light-sensitive composition since the addition thereof would permit the clear discrimination between images and non-image areas after the formation of the images and therefore, image areas of high contrast can thus be obtained. The amount of these dyes to be added to the composition preferably ranges from 0.01 to 10% by weight on the basis of the total solid content of the light-sensitive composition.

The thermally cross-linkable light-sensitive composition may further comprise a nonionic surfactant as disclosed in J.P. KOKAI Nos. Sho 62-251740 and Hei 3-208514 or an amphoteric surfactant as disclosed in J.P. KOKAI Nos. Sho 59-121044 and Hei 4-13149 in order to improve the stability to the developing conditions during the developing process.

Specific examples of the foregoing nonionic surfactants are sorbitan tristearate, sorbitan mono-palmitate, sorbitan tri-oleate, stearic acid monoglyceride and polyoxy-ethylene nonylphenyl ether.

Specific examples of the foregoing amphoteric surfactants are alkyl di(aminoethyl) glycine, alkyl polyamino-ethyl glycine hydrochloride, 2-alkyl-N-carboxy-ethyl-N-hydroxyethyl-imidazolinium betaine and N-tetradecyl-N,N-betaine type ones (trade name: AMORGEN K available from Dai-ichi Kogyo Co., Ltd.).

The amount of the foregoing nonionic and amphoteric surfactants to be incorporated into the thermally cross-linkable light-sensitive composition preferably ranges from 0.05 to 15% by weight and more preferably 0.1 to 5% by weight on the basis of the total solid content of the light-sensitive composition.

Moreover, when applying the thermally cross-linkable light-sensitive composition onto the surface of a substrate in the present invention, a plasticizer may, if needed, be added to the composition for the impartment of the flexibility to the resulting film. Examples of such plasticizers are polyethylene glycol, tributyl citrate, diethyl phthalate, dibutyl phthalate, dihexyl phthalate, di-octyl phthalate, tricresyl phosphate, tributyl phosphate, tri-octyl phosphate and tetrahydrofurfuryl oleate.

In the present invention, the thermally cross-linkable light-sensitive composition is in general used in the form of a coating solution (hereunder also referred to as "coating liquid for preparing a light-sensitive layer") prepared by dissolving the foregoing various kinds of components in a solvent. For this reason, an original plate for making a lithographic printing plate (thermally cross-linkable light-sensitive lithographic printing plate) can be prepared by applying the foregoing coating liquid for preparing a light-sensitive layer containing a variety of components onto the surface of a desired substrate and then drying the coated liquid to form a light-sensitive layer on the substrate. Examples of the foregoing solvents include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxy ethane, methyl lactate, ethyl lactate, N,N-dimethylacetamide, N,N-dimethylformamide, tetramethyl urea, N-methyl pyrrolidone, dimethylsulfoxide, sulfolane, γ-butyrolactone, toluene and water, but the present invention is not restricted to these specific ones at all. These solvents may be used alone or in any combination.

The total solid content of the foregoing various components (or, for instance, the foregoing components (a) to (d) and other components (e)) in the solvent preferably ranges from 1 to 50% by weight on the basis of the total mass of the thermally cross-linkable light-sensitive composition in the form of a coating liquid.

When applying the coating liquid for preparing a light-sensitive layer containing the foregoing various kinds of components onto a substrate, the coated amount of the solid content of the coating liquid determined after the application and drying may vary depending on the applications of the final product, but it in general ranges from 0.5 to 5.0 $g/m^2$ in the preparation of an original plate for making a lithographic printing plate. The smaller the coated amount, the higher the apparent sensitivity, but the film-characteristic properties of the light-sensitive layer may often be reduced.

The method for applying the thermally cross-linkable light-sensitive composition onto the surface of a substrate may appropriately be selected from the known coating methods and examples thereof are bar coater coating, whirler coating, spray coating, curtain coating, dip coating, air knife coating, blade coating and roll coating techniques.

In the present invention, the coating liquid for preparing a light-sensitive layer may further comprise a surfactant such as a fluorine atom-containing surfactant disclosed in J.P. KOKAI Sho 62-170950 for the improvement of the coating properties of the liquid. The amount of the foregoing surfactant to be added to the coating liquid preferably ranges from 0.01 to 1% by weight and more preferably 0.05 to 0.5% by weight on the basis of the mass of the total solid content present in the thermally cross-linkable light-sensitive composition.

<Substrate>

Then the substrate used for preparing a thermally cross-linkable light-sensitive lithographic printing plate will hereunder be described in detail. Such a substrate is preferably a dimensionally stable plate-like material such as paper, paper laminated with plastic films (such as polyethylene, polypropylene, polystyrene films), metal plates (such as aluminum, zinc, copper plates), plastic films (such as cellulose di-acetate, cellulose tri-acetate, cellulose propionate, cellulose butyrate, cellulose acetate butyrate, cellulose nitrate, polyethylene terephthalate, polyethylene, polystyrene, polypropylene, polycarbonate, polyvinyl acetal films) and paper or plastic films laminated with foils of the foregoing metals or on which the foregoing metals are vapor-deposited.

Among them, preferably used herein are polyester films or aluminum plates, with aluminum plates being more preferred because of their excellent dimensional stability and relatively low price. Among these aluminum plates, most preferred are pure aluminum plates, plates of alloys mainly comprising aluminum and trace amounts of foreign elements or plastic films laminated with aluminum foils or on which aluminum is vapor-deposited.

Examples of the foregoing foreign elements included in the aluminum alloys are silicon, iron, manganese, copper, magnesium, chromium, zinc, bismuth, nickel and titanium. The content of foreign elements in the foregoing aluminum alloy is not more than 10% by weight as expressed in terms of the total amount of the elements. Therefore, it is more preferred to use pure aluminum plates, but it is impossible to obtain completely pure aluminum because of the limit in the refining technique. Therefore, the aluminum plate used herein may comprise a trace amount of foreign elements. As has been discussed above, the aluminum plate used in the invention should not have specific compositions and aluminum plates made from the conventionally known and currently used materials may appropriately be used in the present invention. The foregoing aluminum plate used in the invention as a substrate has a thickness preferably ranging from 0.1 to 0.6 mm, more preferably 0.15 to 0.4 mm and most preferably 0.2 to 0.3 mm.

The foregoing aluminum plate is preferably used after it is subjected to a surface-roughening treatment. In this respect, it is, if desired, possible to subject the aluminum plate to a degreasing treatment with, for instance, a surfactant, an organic solvent or an alkaline aqueous solution prior to the surface-roughening treatment. The surface-roughening treatment for the aluminum plate may appropriately be selected from a variety of methods, for instance, mechanical surface-graining methods, methods in which the surface of an aluminum plate is electrochemically dissolved to thus roughen the surface or methods in which the surface of an aluminum plate is chemically and selectively dissolved to thus roughen the surface. Examples of the mechanical surface-roughening methods are ball graining, brush graining, blast graining and buff graining techniques. Examples of the foregoing electrochemically surface-roughening methods are methods, which are carried out in an electrolyte containing hydrochloric acid or nitric acid using an alternating or direct current. In addition, it is also possible to use a combination of the foregoing two methods as disclosed in J.P. KOKAI Sho 54-63902.

The surface-roughened aluminum plate is, if necessary, subjected to an alkali-etching treatment and/or a neutralization treatment and then the plate is anodized for the purpose of enhancing the water retention characteristics and wear resistance of the surface thereof. The electrolytes usable in the anodization treatment are, for instance, various kinds of electrolytes capable of forming a porous anodized layer and examples thereof generally used are sulfuric acid, phosphoric acid, oxalic acid, chromic acid or mixture thereof (mixed acids). The concentration of the foregoing electrolyte may appropriately be determined depending on the kinds of electrolytes.

The conditions for the foregoing anodization treatment may variously vary depending on the specific electrolytes selected and cannot unconditionally be determined, but the anodization is in general and suitably carried out under the following conditions: an electrolyte concentration ranging from 1 to 80% by weight, a temperature of the electrolyte ranging from 5 to 70° C., a current density ranging from 5 to 60 $A/dm^2$, an electric voltage ranging from 1 to 100 V and an electrolyzation time ranging from 10 seconds to 5 minutes. The amount of the anodized layer formed by the treatment is preferably not less than 1.0 $g/m^2$. This is because if the amount of the anodized layer is less than 1.0 $g/m^2$, the resulting layer is insufficient in the resistance or strength, and thus the non-image areas of the plate containing the layer are liable to be damaged. In particular, in case of an original plate for making a lithographic printing plate, ink is often adhered to the damaged portion during printing operations (or the printing plate is liable to cause so-called "damage-staining").

After the anodization treatment, the surface of the aluminum plate is, if needed, subjected to a hydrophilization treatment. Examples of such hydrophilization treatments are the alkali metal silicate methods (for instance, a treatment with a sodium silicate solution) disclosed in U.S. Pat. Nos. 2,714,066; 3,181,461; 3,280,734; and 3,902,734. According to this method, an aluminum plate is dipped in a sodium silicate aqueous solution or subjected to an electrolyzation treatment. Other examples thereof are methods using potassium fluorozirconate disclosed in J.P. KOKOKU Sho 36-22063 and polyvinyl sulfonic acid disclosed in U.S. Pat. Nos. 3,276,868; 4,153,461; and 4,689,272.

In the present invention, the thermally cross-linkable light-sensitive lithographic printing plate can be prepared by applying the foregoing thermally cross-linkable light-sensitive composition onto the surface of a desired substrate to thus form a light-sensitive layer on the substrate, but it is also possible to, if necessary, form a primer layer on the substrate prior to the formation of the light-sensitive layer. Various kinds of organic compounds are used as the components for the primer layer and examples thereof are carboxymethyl cellulose, dextrin, gum Arabic; amino group-containing phosphonic acids such as 2-aminoethyl phosphonic acid; organic phosphonic acids such as phenyl phosphonic acid, naphthyl phosphonic acid, alkyl phosphonic acid, glycerol-phosphonic acid, methylene di-phosphonic acid and ethylene di-phosphonic acid, which may have substituents; organic phosphoric acids such as phenyl phosphoric acid, naphthyl phosphoric acid, alkyl phosphoric acid and glycerol-phosphoric acid, which may have substituents; organic phosphinic acids such as phenyl phosphinic acid, naphthyl phosphinic acid, alkyl phosphinic acid and glycerol-phosphinic acid, which may have substituents; amino acids such as glycine and β-alanine; and hydroxyl group-containing amine hydrochlorides such as triethanolamine hydrochloride. These organic compounds may be used alone or in any combination of at least two of them. Moreover, it is also a preferred embodiment to apply a diazonium salt to form a primer layer.

The coated amount of the foregoing primer layer preferably ranges from 2 to 200 mg/m$^2$ and more preferably 5 to 100 mg/m$^2$. This is because if the coated amount is less than 2 mg/m$^2$, the resulting film does not have sufficient film-characteristic properties. On the other hand, if it exceeds 200 mg/m$^2$, the intended effect thereof cannot be improved any more.

The foregoing primer layer may be formed according to the following method. More specifically, examples thereof are methods in which the foregoing organic compounds are dissolved in water or an organic solvent such as methanol, ethanol or methyl ethyl ketone or mixture thereof to form a solution for forming a primer layer, the solution is applied onto a substrate such as an aluminum plate and then dried; or methods in which the foregoing organic compounds are dissolved in water or an organic solvent such as methanol, ethanol or methyl ethyl ketone or mixture thereof to form a solution for forming a primer layer, a substrate such as an aluminum plate is dipped in the resulting solution to thus adsorb the organic compounds on the substrate, thereafter the substrate is washed with, for instance, water and then dried.

In the former method, it is preferred to use a solution containing the organic compounds in a concentration ranging from 0.005 to 10% by weight in order to prepare a primer layer. On the other hand, in the latter method, the concentration of the organic compound in the solution for preparing a primer layer preferably ranges from 0.01 to 20% by weight and more preferably 0.05 to 5% by weight. In addition, the dipping temperature preferably ranges from 20 to 90° C. and more preferably 25 to 50° C. The dipping time preferably ranges from 0.1 to 20 minutes and more preferably 2 seconds to one minute.

The pH value of the foregoing solution for forming a primer layer may be controlled to the range of from 1 to 12 using a basic substance such as ammonia, triethylamine or potassium hydroxide or an acidic substance such as hydrochloric acid or phosphoric acid. Moreover, when preparing an original plate for making a lithographic printing plate using the thermally cross-linkable light-sensitive composition, a yellow dye may be added to the light-sensitive composition for the improvement of the tone reproduction characteristics.

<Exposure and Development>

As has been discussed above, the thermally cross-linkable light-sensitive lithographic printing plate can be prepared by applying a thermally cross-linkable light-sensitive composition in the form of a coating liquid onto a desired substrate according to any desired method. The thermally cross-linkable light-sensitive lithographic printing plate can be recorded not only by an infrared laser, but also by a UV lamp or by a thermal recording means using, for instance, a thermal head. Examples of such infrared lasers preferably used herein are those emitting infrared beams whose wavelength falls within the range of from 700 to 1200 nm and more preferably solid-state lasers or semiconductor lasers emitting infrared beams whose wavelength falls within the range specified above.

In the present invention, the exposed plate may be developed immediately after the exposure, but the plate may be subjected to a heat treatment between the exposure and the development. This heat treatment is preferably carried out under the following conditions: a temperature ranging from 60 to 150° C. and a treating time ranging from 5 seconds to 5 minutes. The foregoing heat treatment may appropriately be selected from a variety of conventionally known methods. Specific examples thereof include methods in which the thermally cross-linkable light-sensitive layer is heated with, for instance, a panel heater or a ceramic heater while the layer is brought into close contact with the heater; and non-contact heating methods in which the light-sensitive layer is heated with a lamp or warm air. This heat treatment would permit the reduction of the laser energy to be irradiated and required for recording images. After the foregoing heat treatment, the exposed plate is developed using water or an alkaline aqueous solution as a developer.

The alkaline aqueous solution and a replenisher of the solution used in the foregoing developing treatment may be selected from conventionally known alkaline aqueous solutions. Specific examples of such alkaline aqueous solutions are those disclosed in J.P. KOKAI 2000-284474 (Sections 187 to 189).

In particular, the plate-making method of the present invention is one, which makes use of an automatic developing machine, and such an automatic developing machine has a structure already discussed above. In such an automatic developing machine, the exposed plates may be treated while supplementing each replenisher to each processing liquid in proportion to the throughput and working times.

In this case, if an aqueous solution having an alkalinity higher than that of the developer is added to the developer as a replenisher, a large amount of lithographic printing plates can be processed without exchanging the developer in the developing tank over a long period of time. In a preferred embodiment of the present invention, the supplementation of the developer is likewise carried out in this manner.

A variety of surfactants and/or organic solvents may be added to these developers and replenishers for the acceleration or suppression of developing characteristics, dispersion of scum generated during development and the enhancement of the ink-phile properties of the image area on the printing plate. Such surfactants are preferably anionic, cationic, nonionic or amphoteric ones and an example of the foregoing organic solvent is benzyl alcohol. It is also preferred to add to the developer or replenisher, for instance, polyethylene glycol or a derivative thereof or polypropylene glycol or a derivative thereof.

It is also possible to, if necessary, incorporate, into the developer or replenisher, hydroquinone, resorcin, inorganic salt type reducing agents such as sodium or potassium salt of sulfurous acid or sodium or potassium hydrogen sulfite, organic carboxylic acids, anti-foaming agents and/or a water softener.

Examples of developers containing, for instance, the foregoing surfactants, organic solvents and/or reducing agents, which may preferably used herein, are developer compositions containing benzyl alcohol, anionic surfactants, alkali agents and water as disclosed in J.P. KOKAI Sho 51-77401; developer compositions consisting of aqueous solution containing benzyl alcohol, anionic surfactants and water-soluble sulfites as disclosed in J.P. KOKAI Sho 53-44202; and developer compositions containing organic solvents whose solubility in water at ordinary temperature is not more than 10% by weight, alkali agents and water as disclosed in J.P. KOKAI Sho 55-155355.

The lithographic printing plate subjected to the developing treatment using the foregoing developer and replenisher is then post-treated with, for instance, a rinsing liquid containing washing water and a surfactant and a desensitizing solution containing gum Arabic and a starch derivative. The post-treatment may be carried out by variously combining these processing solutions. In addition, the lithographic printing plate may be treated with a substantially fresh processing liquid or may be treated according to the so-called throwaway processing method.

The lithographic printing plate thus produced may be used in the printing step after applying, if desired, a desensitizing gum. The printing plate may likewise be subjected to a burning treatment for the further improvement of the printing durability of the plate. When subjecting the lithographic printing plate to a burning treatment, the plate is preferably processed with a plate (or surface)-conditioning solution such as those described in J.P. KOKOKU Nos. Sho 61-2518 and Sho 55-28062 and J.P. KOKAI Nos. Sho 62-31859 and Sho 61-159655. The plate may be subjected to such a treatment according to, for instance, a method for coating a plate-conditioning solution onto the lithographic printing plate using sponge or absorbent wadding impregnated with the plate-conditioning solution; a method comprising dipping the lithographic printing plate in a vat filled with the plate-conditioning solution; or a coating method using an automatic coater. Moreover, it is also preferred to level the coated amount of the solution using a squeegee or squeegee rolls. In general, the coated amount of the plate-conditioning solution preferably ranges from 0.03 to 0.8 $g/m^2$, as expressed in terms of the solid content determined after the application and drying.

After the plate-conditioning solution is applied onto the lithographic printing plate and then dried, the printing plate is, if needed, heated to a high temperature using, for instance, a burning processor (such as BP-1300 available from Fuji Photo Film Co., Ltd.). The temperature and the heating time may vary depending on the kinds of image-forming components included in the plate, but they preferably range from 180 to 300° C. and 1 to 20 minutes, respectively.

The lithographic printing plate thus subjected to the burning treatment is, if necessary, subjected to the usual treatments such as water-washing and/or gumming treatments, provided that when using a plate-conditioning solution containing, for instance, a water-soluble polymer compound, the so-called desensitizing treatment such as the gumming treatment can be omitted. The lithographic printing plate obtained through these treatments is fitted to, for instance, an offset printing press to thus obtain a large number of printed matters.

The present invention will hereunder be described in more specifically with reference to the following Examples, but the scope of the present invention is not restricted to these specific Examples at all.

EXAMPLE 1

[Preparation of Photopolymerizable Light-Sensitive Lithographic Printing Plate]

After graining the surface of a 1S aluminum plate having a thickness of 0.30 mm using a nylon brush of No. 8 and an aqueous suspension of 800 mesh pumice stone, the aluminum plate was sufficiently washed with water. After etching the aluminum plate by dipping it in a 10% sodium hydroxide solution at 70° C. for 60 seconds, it was washed with running water, washed and neutralized with a 20% $HNO_3$ solution and then washed with water. The aluminum plate was then electrolytically surface-roughened in an electrolyte of a 1% nitric acid aqueous solution at a $V_A$ of 12.7 V and a quantity of anode time electricity of 300 coulomb/$dm^2$, using a sinusoidal alternating waved current. At this stage, the surface roughness thereof was found to be 0.45 µm (expressed in Ra unit). Subsequently, the aluminum plate was immersed in a 30% $H_2SO_4$ aqueous solution, desmutted at 55° C. for 2 minutes and anodized at 33° C. and a current density of 5 A/$dm^2$, for 50 seconds in a 20% $H_2SO_4$ aqueous solution, while arranging a cathode on the grained surface of the plate. As a result, it was found that the thickness of the anodized layer was found to be 2.7 $g/m^2$.

A primer coat layer was applied onto the aluminum plate thus treated according to the following procedures.

The following components of a liquid composition for primer coat were admixed and stirred at 30° C. After about 5 minutes, the generation of heat was observed, the reaction was continued for 60 minutes, the contents of the reactor was transferred to another container and 30,000 parts by weight of methanol was added to the container to give a liquid coating composition.

| (Liquid Composition for Primer Coat) | |
|---|---|
| Compound having the following structure | 50 parts by weight |
| Methanol | 130 parts by weight |
| Water | 20 parts by weight |
| p-Toluene sulfonic acid | 5 parts by weight |
| Tetra-ethoxy-silane | 50 parts by weight |
| 3-Methacryloyloxy-propyl-trimethoxy-silane | 50 parts by weight |

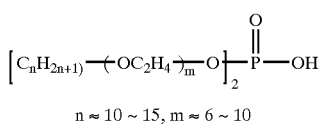

$n \approx 10 \sim 15, m \approx 6 \sim 10$

This coating liquid was applied onto the aluminum plate subjected to the foregoing treatments in an amount of 0.1 g/m² and then dried at 100° C. for one minute.

Then a photopolymerizable light-sensitive composition 1 having the composition specified below was applied onto the primer layer thus prepared in an amount of 1.4 g/m² as expressed in terms of the dried coated amount and then dried at 100° C. for one minute to form a light-sensitive layer.

| (Photopolymerizable Light-Sensitive Composition 1) | |
|---|---|
| Ethylenically unsaturated bond-containing compound (A1) | 2.0 parts by weight |
| Linear organic high molecular weight polymer (B1) | 2.0 parts by weight |
| Sensitizer (C1) | 0.15 parts by weight |
| Photopolymerization initiator (D1) | 0.23 parts by weight |
| Auxiliary sensitizing agent (E1) | 0.3 parts by weight |
| ε-Phthalocyanine (F1) dispersion | 0.022 parts by weight |
| Fluorine atom-containing surfactant, Megafac F176 (available from Dainippon Ink and Chemicals, Inc.) | 0.03 parts by weight |
| Methyl ethyl ketone | 15.0 parts by weight |
| Propylene glycol monomethyl ether acetate | 15.0 parts by weight |

A-1

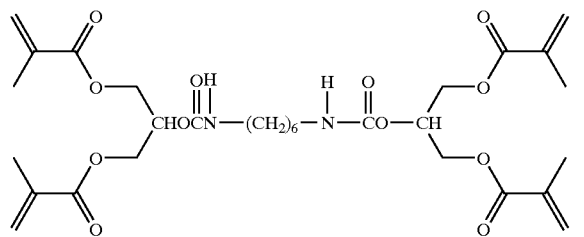

B-1

MDI/HMDI/DMPA/PPG1000 = 80/20/77/23   Mw = 60,000

MDI

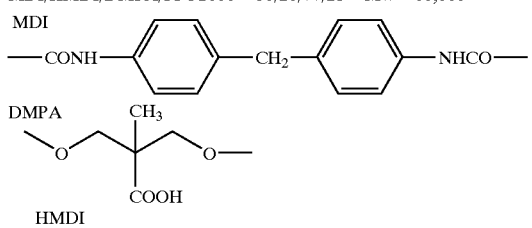

DMPA

HMDI

—CONH—(CH$_2$)$_6$—HNCO—

PPG1000(Mw 1000)

—O—(CH$_2$CHO)$_m$—
            |
           CH$_3$

C1

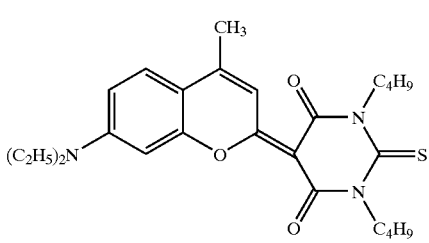

D1

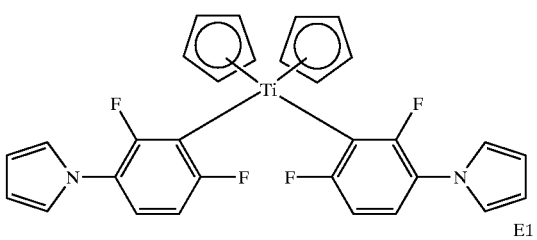

E1

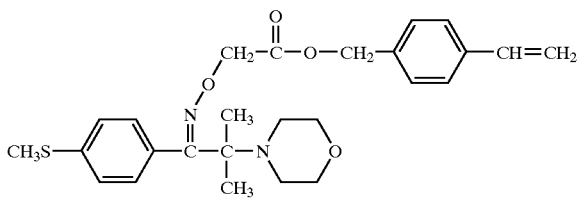

F1

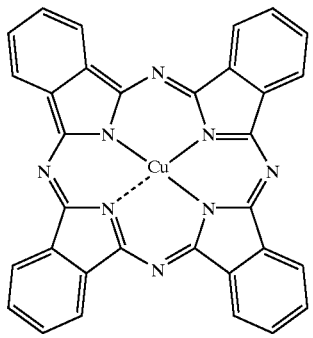

A 6% aqueous solution containing the following ingredients was applied onto the light-sensitive layer as a protective layer having oxygen barrier properties in an amount of 2.5 g/m² as expressed in terms of the dry coated amount and dried at 120° C. for 3 minutes to thus form a photopolymerizable light-sensitive lithographic printing plate.

| | |
|---|---|
| Polyvinyl alcohol (PVA-105, available from Kuraray Co., Ltd. (degree of saponification: 98 mole %; degree of polymerization: 500)) | 2.2 parts by weight |
| Polyvinyl pyrrolidone (K30 available from WACO Pure Chemistry Co., Ltd.) | 0.12 part by weight |
| PIONINE D625 (available from Takemoto Oil and Fats Co., Ltd.) | 0.073 part by weight |
| EMALEX 710 (a surfactant available from Nippon Emulsion Co., Ltd.) | 0.043 part by weight |

[Preparation of Interleaf Paper]

A synthetic sizing agent was added to paper stock prepared by beating bleached kraft pulp and then diluted to a concentration of 4% and then aluminum sulfate was added thereto till the pH value reached 5.0. A paper-strengthening agent mainly comprising starch was applied to this paper stock in an amount of 3.0% by weight, followed by machining to give an interleaf paper having a density of 0.75 g/cm³, a smoothness of 50 seconds, a moisture content of 6.0% and a basis weight of 38 g/m².

[Preparation of Original Plate for Dummy Plate]

A rolled plate of JIS A1050 aluminum material comprising 99.5% by weight of aluminum, 0.01% by weight of copper, 0.03% by weight of titanium, 0.3% by weight of iron and 0.15 by weight of silicon and having a thickness of 0.30 mm was subjected to a surface-graining treatment using a 20% by weight aqueous suspension of 400 mesh pumice stone (available from Kyoritsu Ceramic Materials Co., Ltd.) and a rotating nylon brush (6,10-nylon) and then sufficiently washed with water.

The surface-grained aluminum plate was etched by dipping it in a 15% by weight aqueous sodium hydroxide solution (containing 4.5% by weight of Al) till the amount of aluminum dissolved into the solution was 5 g/m² and then washed with running water. Further, the aluminum plate was neutralized with a 1% by weight nitric acid solution and then electrolytically surface-roughened at 10.5 V of anodic voltage and 9.3 V of cathodic voltage such that the quantity of electricity at the anode time was 160 coulomb/dm², using a rectangular alternating waved voltage (current ratio r=0.90, the current waveform disclosed in J.P. KOKOKU Sho 58-5796). After washing the plate with water, the plate was etched by dipping in a 10% by weight aqueous sodium hydroxide solution maintained at 35° C. till the amount of aluminum dissolved into the solution was 1 g/m² and then washed with water. Then the plate was desmutted by dipping it in a 30% by weight aqueous sulfuric acid solution maintained at 50° C. and then washed with water.

The aluminum plate was further subjected to a treatment for forming a porous anodized layer in a 20% by weight aqueous sulfuric acid solution (containing 0.8% by weight of Al) maintained at 35° C. using a direct current. More specifically, the plate was electrolyzed at a current density of 13 A/dm² and the amount of the anodized layer thus formed was controlled to 2.7 g/m² by adjusting the electrolyzation time. The resulting substrate was washed with water, dipped in a 3% by weight aqueous sodium silicate solution maintained at 70° C. for 30 seconds, washed with water and then dried.

It was found that the aluminum substrate thus produced had a reflection density of 0.30 and a central line averaged surface roughness of 0.58 μm as determined using Macbeth RD920 Reflection densitometer. Then a methyl methacrylate/ethyl acrylate/2-acrylamide-2-methylpropane-sulfonic acid (charge weight ratio of 65/20/15) copolymer, which had partially been converted into sodium salt was dispersed in methanol/water mixture (90/10) to form a 1.0% by weight solution and the resulting solution was applied onto the substrate with a bar coater in a coated amount (weighed after drying) of 0.1 g/m².

Moreover, a composition containing the following components was dissolved in a methanol/methyl ethyl ketone/ 1-methoxy-2-propanol/methyl lactate (30 g/30 g/25 g/12 g) mixed solvent, the resulting solution was coated on the substrate and then dried at 110° C. for 45 seconds. The coated amount thereof as determined after drying was found to be 0.5 g/m².

| | |
|---|---|
| Alkali-soluble urethane binder* (weight average molecular weight: 85,000; acid content: 1.64 meq/g) | 5.0 g |
| Victoria Pure Blue BOH | 0.1 g |
| Sulfo-phthalic acid | 0.3 g |

-continued

| | |
|---|---|
| FC-430 (a fluorine atom-containing surfactant available from 3M Company) | 0.05 g |

*: A reaction product of the following 4 kinds of monomers: 4,4-diphenylmethane diisocyanate 37.5 mole %; hexamethylene diisocyanate 12.5 mole %; 2,2-bis(hydroxy-methyl) propionic acid 32.5 mole %; and tetraethylene glycol 17.5 mole %.

Thereafter, an original plate for making a dummy plate was prepared in the line for processing the usual PS plate, while sandwiching the same between interleaf papers similar to those used in the preparation of the light-sensitive plate.

The photopolymerizable light-sensitive lithographic printing plate and the original plate for making a dummy plate thus prepared and having a size of 80×110 cm were accommodated in cassettes of Luxel Plate Setter P-9600 CTP NEWS available from Fuji Photo Film Co., Ltd. provided with an automatic interleaf paper-removing mechanism, which was equipped with FD-YAG Laser (532 nm), and Sensor Head LV-H42 (650 nm, a semiconductor laser having an output of 3 mW) and Amplification Unit LV-21A (available from KIENCE Company) as an interleaf paper-detecting sensor.

Such an instruction that the space of newspaper should be processed was inputted to the device through a computer of a higher rank. The original plate for making a dummy plate was not exposed to light, while the photopolymerizable light-sensitive lithographic printing plate was imagewise exposed to light under the following conditions: 0.2 mJ/cm², 909 dpi, 100 lpi. Thereafter, the plates were introduced into the automatic developing machine by a light-shielded belt conveyer type transmission zone provided with Sensor Head LV-H42 (650 nm, a semiconductor laser having an output of 3 mW) and Amplification Unit LV-21A (available from KIENCE Company) as an interleaf paper-detecting sensor. An automatic developing machine FLP125NFS (available from Fuji Photo Film Co., Ltd.) was used, the plates were subjected to a post-heat treatment in the pre-heating region, in such a manner that the plate surface temperature and more specifically the temperature of the central portion on the back face of the plate was 115° C. and the protective layer having oxygen barrier properties was removed by washing the plates with water maintained at 40° C. in a pre-water-washing tank.

Subsequently, the plates were developed at 25° C. for 20 seconds in the developing tank using a developer DV-2 (available from Fuji Photo Film Co., Ltd.): water=1:4. Then the plates were washed with water in a water-washing tank, subjected to the usual treatment in a gumming tank using a finishing gum FP-2W (available from Fuji Photo Film Co., Ltd.): water=1:1 and then dried with warm air of 50° C. in a heating region. At this stage, the coated amount of the gumming solution was found to be 150 mg/m² as expressed in terms of the dry mass.

The reflection absorbance and the intensity of the reflected light observed for a) the light-sensitive plate, b) the original plate for making a dummy plate, c) the light-sensitive plate+an interleaf paper (an assembly obtained by putting the plate and paper in layers) and d) the original plate for making a dummy plate+an interleaf paper (an assembly obtained by putting the original plate and paper in layers) as determined, in advance, at 650 nm are listed in the following Table 1. The higher reflection light intensity b) was selected among those observed for a) and b), the smaller reflection light intensity c) was selected among those observed for c)

and d) and the threshold value for the interleaf paper-detecting sensor was determined in such a manner that the value: (b+c)/2 was equal to 48.

TABLE 1

|  | Reflection Absorbance at 650 nm*1 | Intensity of Reflection Light at 650 nm*2 |
|---|---|---|
| a) Light-sensitive plate | 1.040 | 9 |
| b) Original plate for dummy plate | 0.383 | 41 |
| c) Light-sensitive plate + interleaf paper | 0.262 | 55 |
| d) Original plate for dummy plate + interleaf paper | 0.188 | 65 |
| Threshold value of the sensor: (b + c)/2 | 0.322 | 48 |

*1: The value determined by the sensor head LV-H42 (650 nm, a semiconductor laser having an output of 3 mW; available from KIENCE Company).
*2: The value calculated from the reflection absorbance, while the intensity of incident light rays is assumed to be 100.

The light-sensitive plates (200 plates) and the original plates for dummy plates (20 plates) were formed into lithographic printing plates and dummy plates respectively in a day. The interleaf papers were certainly removed by the plate-setter and the interleaf paper-detecting sensor was operated without any trouble.

This plate-making operation was continued over one month and it was confirmed that the interleaf papers were certainly removed by the plate-setter and that the interleaf paper-detecting sensor was operated without any trouble.

Then, 50 plates of light-sensitive plates provided with interleaf papers, one light-sensitive plate to which an interleaf paper was intentionally adhered with a double-coated tape and further 100 plates of light-sensitive plates provided with interleaf papers were accommodated in the cassette of the plate-setter. Thereafter the plate-making operation was carried out according to the same procedures used above. As a result, it was observed that the device was normally operated till 100 plates of the light-sensitive plates provided with interleaf papers, but the interleaf paper was not removed from the 101$^{st}$ light-sensitive plate and the device was automatically stopped and the 101$^{st}$ plate remained in the plate-setter.

The foregoing clearly indicates that the sensor certainly detects the fact that the interleaf paper is not removed from the light-sensitive plate and outputs such a signal to the plate-setter or that the sensor can correctly detect the presence of any interleaf paper.

EXAMPLE 2

[Preparation of Thermally Cross-Linkable Light-Sensitive lithographic Printing Plate]
<Synthesis of Cross-linking Agent "KZ-9">

In an aqueous potassium hydroxide solution, 1-[α-methyl-α-(4-hydroxyphenyl) ethyl]-4 [α,α-bis (4-hydroxyphenyl) ethyl] benzene was reacted with formalin, the reaction solution was then acidified by the addition of sulfuric acid to thus precipitate the reaction product, followed by recrystallization from methanol to thus give a cross-linking agent (KZ-9) having the following structure. The purity thereof was determined by the reverse phase HPLC and it was found to be 92%.

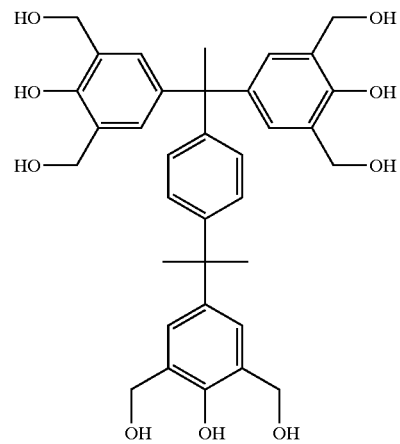

KZ-9

<Acquisition of Alkaline Water-Soluble Polymer Compound "BP-1">

Poly(p-hydroxy-styrene) (trade name: MALKA LINKER MS-4P available from Maruzen Petroleum Chemical Co., Ltd.) was purchased and used as the alkaline water-soluble polymer compound (BP-1).

An aluminum plate (material: 1050) having a thickness of 0.30 mm was degreased by washing the plate with trichloroethylene, the surface thereof is then grained using a nylon brush and 400 mesh pumice stone-water suspension and sufficiently washed with water. This aluminum plate was etched by immersing the same in a 25% aqueous sodium hydroxide solution (45° C.) for 9 seconds, washed with water, further immersed in a 2% aqueous nitric acid solution for 20 seconds and then washed with water. At this stage, the amount of the surface-grained aluminum plate removed through the etching was found to be about 3 g/m$^2$.

Then a DC anodized layer was formed on the aluminum plate in an amount of 3 g/m$^2$ using a 7% sulfuric acid solution as an electrolyte and a current density of 15 A/dm$^2$, the plate was washed with water and then dried. Thereafter, the following solution for preparing a primer coating layer was applied onto the aluminum plate and then dried in an atmosphere maintained at 80° C. for 30 seconds. The coated amount of the solution after drying was found to be 10 mg/m$^2$.

<Preparation of Primer Coat Solution>

Components listed below were admixed together to form a solution for preparing a primer coat layer:

| 2-Aminoethyl-phosphonic acid | 0.5 g |
|---|---|
| Methanol | 40 g |
| Pure water | 60 g |

<Preparation of Coating Solution for Light-Sensitive Layer>

Components listed below were admixed together to form a coating solution for preparing a thermally cross-linkable light-sensitive layer.

Composition of Coating Solution for Thermally Cross-linkable Light-sensitive Layer

| Acid generator "SH-1" having the following structure | 0.2 g |
|---|---|
| Cross-linking agent "KZ-9" | 0.6 g |

-continued

| | |
|---|---|
| Alkaline water-soluble polymer compound "BP-1" | 1.4 g |
| Infrared-absorbing dyestuff "1K-1" having the structure given below | 0.2 g |
| 1-Naphthalene-sulfonic acid salt of Victoria Pure Blue | 0.04 g |
| Fluorine atom-containing surfactant (Megafac F-176 available from Dainippon Ink and Chemicals, Inc.) | 0.01 g |
| Methyl ethyl ketone | 3.0 g |
| Methanol | 16 g |
| 1-Methoxy-2-propanol | 8.0 g |

The structures of the acid generator "SH-1" and the infrared-absorbing dyestuff "IK-1" used in the coating solution for light-sensitive layer are given below:

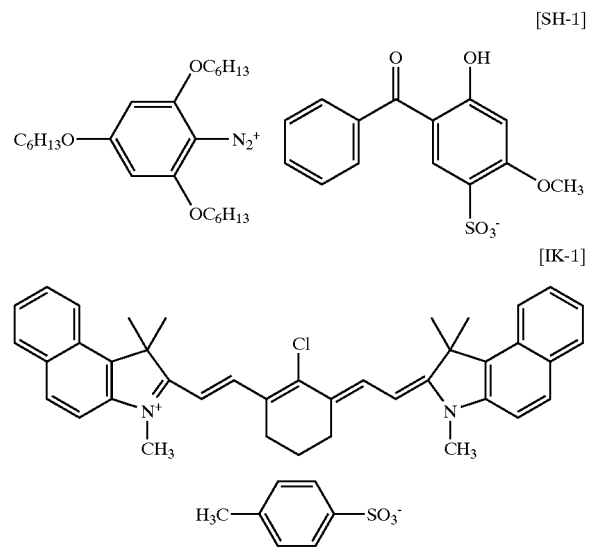

[SH-1]

[IK-1]

<Preparation of Thermally Cross-Linkable Light-Sensitive Lithographic Printing Plate>

The foregoing coating solution for preparing a light-sensitive layer was applied onto the aluminum plate in an amount of 1.5 g/m² as expressed in terms of the amount determined after drying and then dried at 100° C. for one minute to form a thermally cross-linkable light-sensitive lithographic printing plate provided with a thermally cross-linkable light-sensitive layer.

Thereafter, a light-sensitive plate was prepared while it was sandwiched between interleaf papers similar to those prepared in Example 1. In this respect, an original plate of Ex. 2 for preparing a dummy plate was prepared by repeating the same procedures used in Example 1 except that BP-1 was substituted for the alkali-soluble urethane binder used in Example 1.

The thermally cross-linkable light-sensitive lithographic printing plate and the original plate for making a dummy plate thus prepared and having a size of 80×110 cm were accommodated in cassettes of Luxel Plate Setter T9000 (available from Fuji Photo Film Co., Ltd.) provided with an automatic interleaf paper-removing mechanism, which was equipped with an infrared semiconductor laser (830 nm, 40 W), and Sensor Head LV-H42 (650 nm, a semiconductor laser having an output of 3 mW) and Amplification Unit LV-21A (available from KIENCE Company) as an interleaf paper-detecting sensor.

Such an instruction that the space of newspaper should be processed was inputted to the device through a computer of a higher rank. The original plate for making a dummy plate was not exposed to light, while the thermally cross-linkable light-sensitive lithographic printing plate was exposed to light at an irradiated energy of 133 mJ/cm². Thereafter, the plates were introduced into the automatic developing machine by a light-shielded belt conveyer type transmission zone provided with Sensor Head LV-H42 (650 nm, a semiconductor laser having an output of 3 mW) and Amplification Unit LV-21A (available from KIENCE Company) as an interleaf paper-detecting sensor. After heat-treating the plates at 145° C. for 75 seconds using a warm air heating device (Oven available from Wisconsin Company), these plates were developed using a developer DT-N (available from Fuji Photo Film Co., Ltd.): water=1:8.

The reflection absorbance and the intensity of the reflected light observed for e) the light-sensitive plate, b) the original plate for making a dummy plate, f) the light-sensitive plate+an interleaf paper (an assembly obtained by putting the plate and paper in layers) and d) the original plate for making a dummy plate+an interleaf paper (an assembly obtained by putting the original plate and paper in layers) as determined by the same method used in Example 1 are listed in the following Table 2.

TABLE 2

| | Reflection Absorbance at 650 nm*1 | Intensity of Reflection Light at 650 nm*2 |
|---|---|---|
| e) Light-sensitive plate | 1.154 | 7 |
| b) Original plate for dummy plate | 0.383 | 41 |
| f) Light-sensitive plate + interleaf paper | 0.269 | 54 |
| d) Original plate for dummy plate + interleaf paper | 0.188 | 65 |
| Threshold value of the sensor: (b + f)/2 | 0.322 | 48 |

*1: The value determined by the sensor head LV-H42 (650 nm, a semiconductor laser having an output of 3 mW; available from KIENCE Company).
*2: The value calculated from the reflection absorbance, while the intensity of incident light rays is assumed to be 100.

The light-sensitive plates (200 plates) and the original plates for dummy plates (20 plates) were formed into lithographic printing plates and dummy plates respectively in a day. The interleaf papers were certainly removed by the plate-setter and the interleaf paper-detecting sensor was operated without any trouble.

This plate-making operation was continued over one month and it was confirmed that the interleaf papers were certainly removed by the plate-setter and that the interleaf paper-detecting sensor was operated without any trouble.

Then, 50 plates of light-sensitive plates provided with interleaf papers, one light-sensitive plate to which an interleaf paper was intentionally adhered with a double-coated tape and further 100 plates of light-sensitive plates provided with interleaf papers were accommodated in the cassette of the plate-setter. Thereafter the plate-making operation was carried out according to the same procedures used above. As a result, it was observed that the device was normally operated till 100 plates of the light-sensitive plates provided with interleaf papers, but the interleaf paper was not removed from the $101^{st}$ light-sensitive plate and the device was automatically stopped and the $101^{st}$ plate remained in the plate-setter.

The foregoing clearly indicates that the sensor certainly detects the fact that the interleaf paper is not removed from the light-sensitive plate and outputs such a signal to the plate-setter or that the sensor can correctly detect the presence of any interleaf paper.

As has been described above in detail, the plate-making method of the present invention permits the reliable detection of the presence of interleaf papers on light-sensitive lithographic printing plates and/or original plates for dummy plates and the plate-making operations can thus stably be carried out using a plate-setter and an automatic developing machine.

What is claimed is:

1. A plate-making system in which a light-sensitive lithographic printing plate carrying an interleaf paper superimposed thereon and/or an original plate for making a dummy plate carrying an interleaf paper superimposed thereon are processed in a plate-setter provided with an automatic interleaf paper-removing mechanism and an automatic developing machine, the system being characterized in that it comprises a means for detecting the presence of any interleaf paper on the light-sensitive lithographic printing plate and/or the original plate for making a dummy plate or a means for discriminating the interleaf paper, the light-sensitive lithographic printing plate and the original plate for making a dummy plate from one another, said means for detection or means for discrimination being disposed downstream of the automatic interleaf paper-removing mechanism.

2. The system of claim 1, wherein the means for detecting the presence of any interleaf paper comprises an optical sensor, which comprises a light-projecting portion for irradiating the interleaf paper, the light-sensitive lithographic printing plate and/or the original plate for making a dummy plate with sensor light rays and a light-receiving portion for receiving light rays reflected from the same; and a control means for outputting a control signal after detecting the presence of the interleaf paper on the basis of the intensity of the reflected light received by the light-receiving portion.

3. The system of claim 2, wherein the control means comprises a means for transmitting signals to the plate-setter or the automatic developing machine to stop the transmission of the light-sensitive lithographic printing plate and/or the original plate for dummy plates, when the presence of an interleaf paper is detected.

4. The system of claim 2, wherein the control means comprises a means for transmitting signals to the interleaf paper-removing mechanism to again remove the interleaf paper, when the presence of an interleaf paper is detected.

5. The system of claim 2, wherein the control means comprises a means for transmitting signals to a means to display a warning or to output an alarm signal, when the presence of an interleaf paper is detected.

6. The system of claim 2, wherein the control means comprises a means for transmitting signals to the plate-setter to omit an exposure treatment, when the presence of interleaf paper is not detected but an original plate for dummy plate is detected.

7. The system of claim 1, wherein the means for discriminating the interleaf paper, the light-sensitive lithographic printing plate and the original plate for making a dummy plate from one another comprises a light-projecting portion for irradiating the interleaf paper, the light-sensitive lithographic printing plate and/or the original plate for making a dummy plate with sensor light rays and a light-receiving portion for receiving light rays reflected from the same; and a control means for outputting a control signal after discriminating the interleaf paper, the original plate for dummy plates or the light-sensitive lithographic printing plate from one another on the basis of the intensity of the reflected light received by the light-receiving portion.

8. The system of claim 7, wherein the control means comprises a means for transmitting signals to the plate-setter or the automatic developing machine to stop the transmission of the light-sensitive lithographic printing plate and/or the original plate for dummy plates, when the presence of an interleaf paper is detected.

9. The system of claim 7, wherein the control means comprises a means for transmitting signals to the interleaf paper-removing mechanism to again remove the interleaf paper, when the presence of an interleaf paper is detected.

10. The system of claim 7, wherein the control means comprises a means for transmitting signals to a means to display a warning or to output an alarm signal, when the presence of an interleaf paper is detected.

11. The system of claim 7, wherein the control means comprises a means for transmitting signals to the plate-setter to omit an exposure treatment, when the presence of interleaf paper is not detected but an original plate for dummy plate is detected.

12. A plate-making method in which a light-sensitive lithographic printing plate carrying an interleaf paper superimposed thereon and/or an original plate for making a dummy plate carrying an interleaf paper superimposed thereon are processed in a plate-setter provided with an automatic interleaf paper-removing mechanism and an automatic developing machine, the method being characterized by irradiating the interleaf paper, the light-sensitive lithographic printing plate and the original plate for making a dummy plate with sensor light rays after they are passed through the automatic interleaf paper-removing mechanism and determining the intensity of the light reflected from the same to thus detect any interleaf paper possibly present on the plates and/or to thus discriminate the interleaf paper, the light-sensitive lithographic printing plate and the original plate for making a dummy plate from each other.

13. The method of claim 12, wherein the original plate for making a dummy plate comprises an aluminum substrate having a hydrophilic surface provided thereon with a light-insensitive resin layer capable of being dissolved in or getting swollen with an alkaline aqueous solution.

14. The method of claim 13, wherein the light-insensitive resin is a polyurethane resin soluble in an alkali solution.

15. The method of claim 12, wherein the light-sensitive lithographic printing plate is a photopolymerizable light-sensitive lithographic printing plate or a thermally cross-linkable light-sensitive lithographic printing plate.

16. The method of claim 12, further comprising transmitting signals to the plate-setter or the automatic developing machine to stop the transmission of the light-sensitive lithographic printing plate and/or the original plate for dummy plates, when the presence of an interleaf paper is detected.

17. The method of claim 12, further comprising transmitting signals to the interleaf paper-removing mechanism to again remove the interleaf paper, when the presence of an interleaf paper is detected.

18. The method of claim 12, further comprising transmitting signals to a means to display a warning or to output an alarm signal, when the presence of an interleaf paper is detected.

19. The method of claim 12, further comprising transmitting signals to the plate-setter to omit an exposure treatment, when the presence of interleaf paper is not detected but an original plate for dummy plate is detected.

20. A plate-making system including one or both of a light-sensitive lithographic printing plate carrying an interleaf paper superimposed thereon and an original plate for making a dummy plate carrying an interleaf paper superimposed thereon, which one or both of said plates are processed in a plate-setter provided with an automatic interleaf paper-removing mechanism and an automatic developing machine, the system being characterized in that it comprises a means for detecting the presence of any interleaf paper on the light-sensitive lithographic printing plate and/or the original plate for making a dummy plate or a means for discriminating the interleaf paper, the light-sensitive lithographic printing plate and the original plate for making a dummy plate from one another, said means for detection or means for discrimination being disposed downstream of the automatic interleaf paper-removing mechanism, wherein the original plate for making a dummy plate comprises an aluminum substrate having a hydrophilic surface provided thereon with a light-insensitive resin layer capable of being dissolved in or getting swollen with an alkaline aqueous solution.

21. The system of claim 20, wherein the light-insensitive resin is a polyurethane resin soluble in an alkali solution.

22. The system of claim 20, wherein the light-sensitive lithographic printing plate is a photopolymerizable light-sensitive lithographic printing plate or a thermally cross-linkable light-sensitive lithographic printing plate.

* * * * *